United States Patent
Lee et al.

(10) Patent No.: US 9,276,574 B2
(45) Date of Patent: *Mar. 1, 2016

(54) SCAN FLIP-FLOP CIRCUITS AND SCAN TEST CIRCUITS INCLUDING THE SAME

(71) Applicant: Samsung Electronics Co., Ltd., Suwon-si, Gyeonggi-do (KR)

(72) Inventors: Hoi-jin Lee, Seoul (KR); Bai-Sun Kong, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 147 days.

This patent is subject to a terminal disclaimer.

(21) Appl. No.: 13/890,517

(22) Filed: May 9, 2013

(65) Prior Publication Data

US 2013/0241594 A1    Sep. 19, 2013

Related U.S. Application Data

(62) Division of application No. 13/154,731, filed on Jun. 7, 2011, now Pat. No. 8,441,279.

(30) Foreign Application Priority Data

Jun. 10, 2010 (KR) .......... 10-2010-0055006

(51) Int. Cl.
*H03K 19/003* (2006.01)
*H03K 3/356* (2006.01)

(52) U.S. Cl.
CPC ........ *H03K 19/003* (2013.01); *H03K 3/356182* (2013.01)

(58) Field of Classification Search
None
See application file for complete search history.

(56) References Cited

U.S. PATENT DOCUMENTS

| | | |
|---|---|---|
| 2006/0156116 A1 | 7/2006 | Allen et al. |
| 2009/0015321 A1* | 1/2009 | Hamdan et al. ............... 327/544 |
| 2009/0210728 A1* | 8/2009 | Saint-Laurent et al. ...... 713/320 |
| 2010/0308864 A1 | 12/2010 | Lee et al. |

FOREIGN PATENT DOCUMENTS

| | | |
|---|---|---|
| JP | 2001141785 A | 5/2001 |
| JP | 2007248381 A | 9/2007 |
| JP | 2009288056 A | 12/2009 |

* cited by examiner

*Primary Examiner* — Jany Richardson
(74) *Attorney, Agent, or Firm* — Harness, Dickey & Pierce, P.L.C.

(57) ABSTRACT

A scan flip-flop circuit includes an input unit and an output unit. The data output unit is configured to provide a data output terminal with a data output signal in response to a data input signal and a first control signal in a first operation mode, and the data output unit is configured to prohibit the data output terminal from being provided with a power supply voltage and a ground voltage applied to the scan flip-flop circuit in response to the data input signal and the first control signal in a second operation mode. The scan output unit is configured to provide a scan output terminal with a scan output signal in response to a scan input signal and a second control signal in the second operation mode.

18 Claims, 16 Drawing Sheets

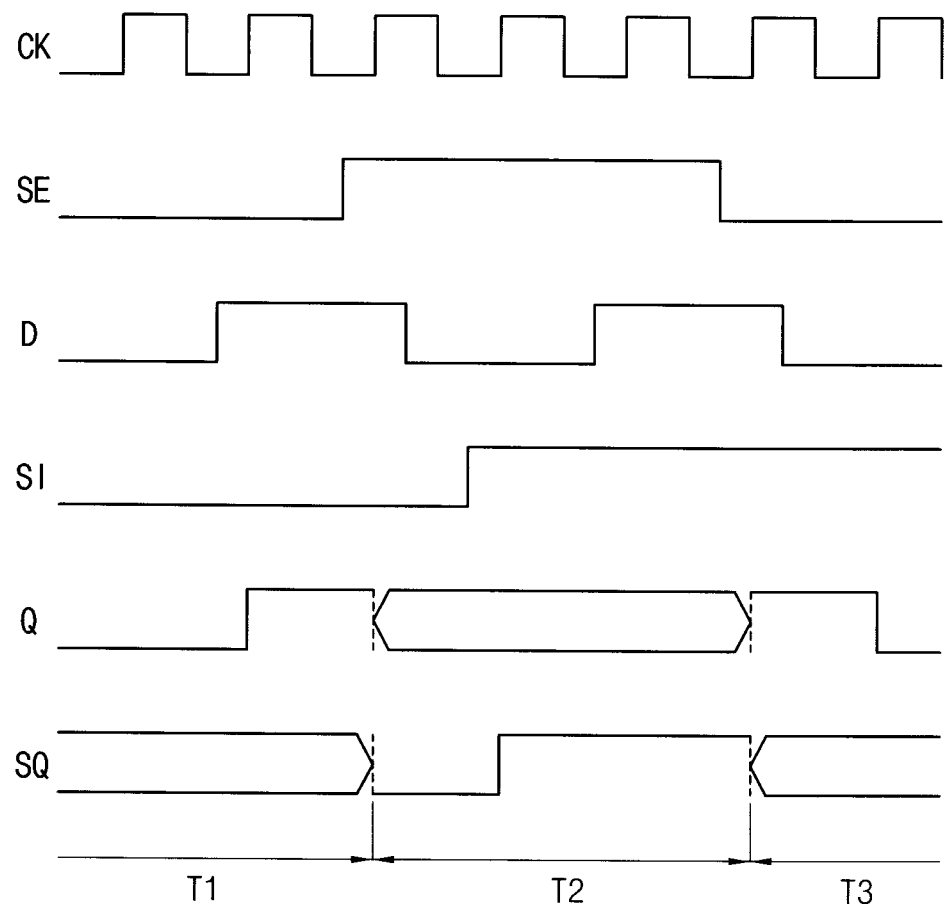

SCAN FLIP-FLOP CIRCUITS AND SCAN TEST CIRCUITS INCLUDING THE SAME

CROSS-REFERENCE TO RELATED APPLICATION

This application is a divisional of U.S. application Ser. No. 13/154,731, filed Jun. 7, 2011, which claims priority under 35 U.S.C. §119 to Korean Patent Application No. 2010-0055006, filed on Jun. 10, 2010 in the Korean Intellectual Property Office (KIPO), the entire contents of each of which are herein incorporated by reference.

BACKGROUND

1. Technical Field

Example embodiments relate to flip-flop circuits, and more particularly to scan flip-flop circuits having a scan function and scan test circuits including the scan flip-flop circuit.

2. Description of the Related Art

The type of semiconductor testing technique used to test a semiconductor device is as much a design/production consideration as improving density and a complexity of the semiconductor device itself. Reduction of time and cost as well as improvement of testability are considered for mass production of a semiconductor memory device. Thus, a design-for-testability (DFT) scheme is widely used to improve efficiency of testing during a design phase of the semiconductor device.

SUMMARY

Some example embodiments provide a scan flip-flop circuit configured to effectively provide one of a data output signal and a scan output signal depending on operation modes.

Some example embodiments provide a scan test circuit including the scan flip-flop circuit.

According to some example embodiments, a scan flip-flop circuit includes an input unit and an output unit. The input unit selects one of a data input signal and a scan input signal depending on an operation mode and generates an intermediate signal based on the selected signal. The output unit generates an output signal based on the intermediate signal and selects one of a data output terminal and a scan output terminal depending on the operation mode to provide the output signal through the selected output terminal. The selected output terminal is configured to output a voltage level that bidirectionally transitions between a first voltage level and a second voltage level. A non-selected output terminal is configured to output a voltage level that unidirectionally transitions between the first voltage level and the second voltage level.

The output unit is configured to generate a data output signal of the output signal based on the intermediate signal and may provide the data output signal through the data output terminal in a first operation mode, and generate a scan output signal of the output signal based on the intermediate signal and may provide the scan output signal through the scan output terminal in a second operation mode.

The scan output terminal is configured to output the voltage level unidirectionally transitioning between the first voltage level and the second voltage level in the first operation mode. The data output terminal is configured to output the voltage unidirectionally transitioning between the first voltage level and the second voltage level in the second operation mode.

In an example embodiment, the output unit may include a latch unit, a data output unit and a scan output unit. The latch unit may latch the intermediate signal. The data output unit may generate a data output signal of the output signal based on the intermediate signal and a first control signal to provide the data output signal through the data output terminal in a first operation mode and may prevent a voltage level at the data output terminal from toggling based on the first control signal in a second operation mode. The scan output unit may generate a scan output signal of the output signal based on the intermediate signal and a second control signal to provide the scan output signal through the scan output terminal in the second operation mode and may prevent a voltage level at the scan output terminal from toggling based on the second control signal in the first operation mode.

The data output unit may include a buffer unit and a power switching unit. The buffer unit may generate the data output signal based on the intermediate signal in the first operation mode. The power switching unit may activate the buffer unit in the first operation mode and may deactivate the buffer unit in the second operation mode in response to the first control signal.

The buffer unit may include a first metal oxide semiconductor (MOS) transistor and a second MOS transistor. The first MOS transistor may have a first electrode, a gate electrode connected to the intermediate signal, and a second electrode connected to the data output terminal. The second MOS transistor may have a first electrode connected to the data output terminal, a gate electrode connected to the intermediate signal, and a second electrode.

In an example embodiment, the first electrode of the first MOS transistor may be connected to a power supply voltage. The power switching unit may include a switching transistor having a first electrode connected to the second electrode of the second MOS transistor, a gate electrode connected to the first control signal, and a second electrode connected to a ground voltage.

In another example embodiment, the second electrode of the second MOS transistor may be connected to a ground voltage. The power switching unit may include a switching transistor having a first electrode connected to a power supply voltage, a gate electrode connected to the first control signal, and a second electrode connected to the first electrode of the first MOS transistor.

The scan output unit may include a buffer unit and a power switching unit. The buffer unit may generate the scan output signal based on the intermediate signal in the second operation mode. The power switching unit may activate the buffer unit in the second operation mode and configured to deactivate the buffer unit in the first operation mode in response to the second control signal.

The buffer unit may include a first MOS transistor and a second MOS transistor. The first MOS transistor may have a first electrode, a gate electrode connected to the intermediate signal, and a second electrode connected to the scan output terminal. The second MOS transistor may have a first electrode connected to the scan output terminal, a gate electrode connected to the intermediate signal, and a second electrode.

In an example embodiment, the first electrode of the first MOS transistor may be connected to a power supply voltage. The power switching unit may include a switching transistor having a first electrode connected to the second electrode of the second MOS transistor, a gate electrode connected to the second control signal, and a second electrode connected to a ground voltage.

In another example embodiment, the second electrode of the second MOS transistor may be connected to a ground voltage. The power switching unit may include a switching transistor having a first electrode connected to a power supply voltage, a gate electrode connected to the second control signal, and a second electrode connected to the first electrode of the first MOS transistor.

The output unit may further include a data output enhancement unit. The data output enhancement unit may be coupled between the data output terminal and the scan output terminal configured to modify the data output signal based on a third control signal in the first operation mode.

In an example embodiment, the data output enhancement unit may include a transmission gate. The transmission gate may allow current flowing through the scan output terminal to modify the data output signal based on the third control signal in the first operation mode and may electrically disconnect the scan output terminal with the data output terminal based on the third control signal in the second operation mode.

In another example embodiment, the data output enhancement unit may include a tri-state inverter. The tri-state inverter may provide an additional current to the data output terminal in the first operation mode based on the third control signal and the voltage level at the scan output terminal.

In an example embodiment, the output unit may include a latch unit, a data output unit and a scan output unit. The latch unit may latch the intermediate signal to generate a latch signal. The data output unit may generate a data output signal of the output signal based on the intermediate signal and a first control signal to provide the data output signal through the data output terminal in a first operation mode and may prevent a voltage level at the data output terminal from toggling based on the first control signal in a second operation mode. The scan output unit may generate a scan output signal of the output signal based on the latch signal and a second control signal to provide the scan output signal through the scan output terminal in the second operation mode and may prevent a voltage level at the scan output terminal from toggling based on the second control signal in the first operation mode.

The scan output unit may include a buffer unit and a power switching unit. The buffer unit may generate the scan output signal based on the latch signal in the second operation mode. The power switching unit may activate the buffer unit in the second operation mode and may deactivate the buffer unit in the first operation mode in response to the second control signal.

According to some example embodiments, a scan test circuit includes a first scan flip-flop circuit, a combinational logic circuit and a second scan flip-flop circuit. The first scan flip-flop circuit selects one of a first data input signal and a scan input signal as a first input signal depending on an operation mode, generates one of a first data output signal and a first scan output signal as a first output signal based on the first input signal and selects one of a first data output terminal and a first scan output terminal as a first output terminal depending on the operation mode to provide the first output signal through the first output terminal. The combinational logic circuit performs a logic operation on the first data output signal to generate a second data input signal. The second scan flip-flop circuit selects one of the second data input signal and the first scan output signal as a second input signal depending on the operation mode, generates one of a second data output signal and a second scan output signal as a second output signal based on the second input signal and selects one of a second data output terminal and a second scan output terminal as a second output terminal depending on the operation mode to provide the second output signal through the second output terminal. The selected first and second output terminals are configured to output voltage levels that bidirectionally transition between a first voltage level and a second voltage level, respectively. Non-selected first and second output terminals are configured to output a voltage levels that unidirectionally transition between the first voltage level and the second voltage level, respectively.

The first scan flip-flop is configured to generate the first data output signal based on the first data input signal to provide the first data output signal through the first data output terminal in a first operation mode and generate the first scan output signal based on the scan input signal to provide the first scan output signal through the first scan output terminal in a second operation mode. The second scan flip-flop is configured to generate the second data output signal based on the second data input signal to provide the second data output signal through the second data output terminal in the first operation mode and generate the second scan output signal based on the first scan output signal to provide the second scan output signal through the second scan output terminal in the second operation mode.

The scan test circuit may further include a second combinational logic circuit and a third combinational logic circuit. The second combinational logic circuit may perform the logic operation on input data to generate the first data input signal. The third combinational logic circuit may perform the logic operation on the second data output signal to generate output data.

In at least another example embodiment, a scan flip-flop circuit includes an input unit configured to receive a data input signal and a scan input signal, the input unit is configured to output an intermediate signal based on one of the data input signal and the scan input signal, and an output unit including a data output terminal and a scan output terminal, the output unit is configured to output an output signal at one of the output terminal and scan output terminal based on the intermediate signal.

The output unit is configured to output the output signal having a voltage alternating between a first voltage level and a second voltage level.

The output unit is configured to select one of the data output terminal and the scan output terminal to output the output signal based on an operation mode. The non-selected output terminal is configured to output a signal that changes from a first voltage level to a second voltage level one time during a first operation mode.

Accordingly, in the scan flip-flop circuit according to some example embodiments, the output unit includes two separated output terminals, that are the data output terminal and the scan output terminal. The scan flip-flop circuit may prevent the voltage level at one of the data output terminal and the scan output terminal from toggling between the first voltage level and the second voltage level depending on the operation modes. Thus, the scan flip-flop circuit may effectively provide one of the data output signal and the scan output signal depending on the operation modes. In addition, the output unit may further include the data output enhancement unit, thereby enhancing the current of the data output signal and the drivability of the scan flip-flop circuit in the first operation mode.

In a semiconductor device including the scan flip-flop circuit, a data path and a scan path are separated from each other. In the scan test mode, the variation of the voltage level of the data path and a voltage drop in a power network of the semiconductor device may be reduced. In addition, the variation of the hold time of the scan flip-flop-circuit may be reduced. Thus, the semiconductor device including the scan flip-flop circuit may have relatively high operation speed and low power consumption.

BRIEF DESCRIPTION OF THE DRAWINGS

Illustrative, non-limiting example embodiments will be more clearly understood from the following detailed description taken in conjunction with the accompanying drawings.

FIG. 12 is a timing diagram illustrating an operation of the scan flip-flop circuit of FIG. 1.

DETAILED DESCRIPTION OF EXAMPLE EMBODIMENTS

Figure 1:
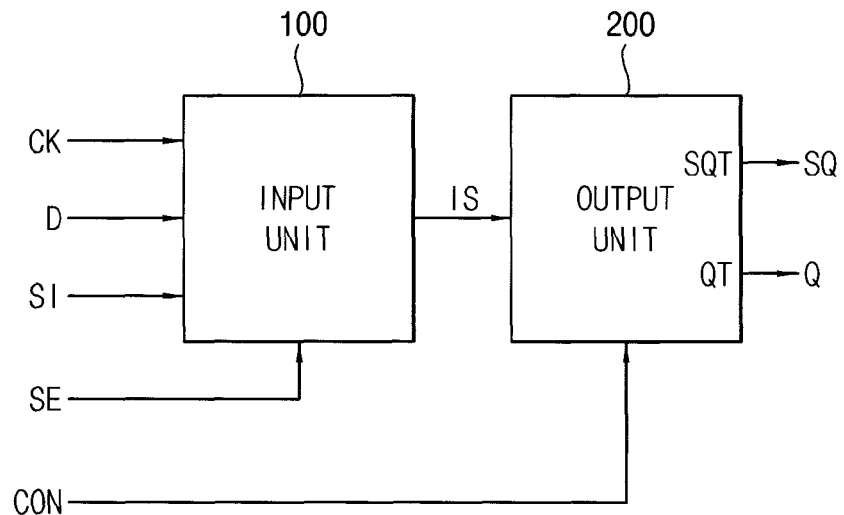
FIG. 1 is a block diagram illustrating a scan flip-flop circuit according to some example embodiments.

Various example embodiments will be described more fully with reference to the accompanying drawings, in which embodiments are shown. Inventive concepts may, however, be embodied in many different forms and should not be construed as limited to the embodiments set forth herein. Rather, example embodiments are provided so that this disclosure will be thorough and complete, and will fully convey the scope of inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing example embodiments and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a scan flip-flop circuit according to some example embodiments.

Referring to FIG. 1, the scan flip-flop circuit 1000 includes an input unit 100 and an output unit 200.

The scan flip-flop circuit 1000 may operate alternatively in two modes, that is, a normal operation mode or a scan test mode. Hereinafter, the normal operation mode may be referred to as a first operation mode and the scan test mode may be referred to as a second operation mode. The scan flip-flop circuit 1000 may perform different operations depending on the operation modes.

The input unit 100 receives a clock signal CK, a data input signal D, a scan input signal SI and a scan enable signal SE. The input unit 100 selects one of the data input signal D and the scan input signal SI depending on the operation modes and generates an intermediate signal IS based on the selected signal. For example, the input unit 100 may select the data input signal D and may generate the intermediate signal IS based on the data input signal D in the first operation mode. The input unit 100 may select the scan input signal SI and may generate the intermediate signal IS based on the scan input signal SI in the second operation mode.

The operation modes of the scan flip-flop circuit 1000 may be determined based on the scan enable signal SE. In an example embodiment, when the scan enable signal SE has a first logic level, the scan flip-flop circuit 1000 may operate in the first operation mode. When the scan enable signal SE has a second logic level, the scan flip-flop circuit 1000 may operate in the second operation mode. In another example embodiment, when the scan enable signal SE has the second logic level, the scan flip-flop circuit 1000 may operate in the first operation mode. When the scan enable signal SE has the first logic level, the scan flip-flop circuit 1000 may operate in the second operation mode. The first logic level may be a logic low level and the second logic level may be a logic high level. The scan enable signal SE may also be used for selecting one of the data input signal D and the scan input signal SI.

The output unit 200 receives the intermediate signal IS and at least one control signal CON. The at least one control signal CON may include a plurality of signals that controls operations of the output unit 200. For example, the at least one control signal CON may include the scan enable signal SE and the clock signal CK. The output unit 200 generates an output signal based on the intermediate signal IS and selects one of a data output terminal and a scan output terminal depending on the operation modes to provide the output signal through the selected output terminal. A voltage level at the selected output terminal bidirectionally transitions between a first voltage level and a second voltage level. A voltage level at a non-selected output terminal unidirectionally transitions between the first voltage level and the second voltage level. The first voltage level may be a ground voltage level and the second voltage level may be a power supply voltage level.

The output signal may be one of a data output signal Q and a scan output signal SQ output from a corresponding data output terminal QT or a scan output terminal SQT.

As used herein, the term "bidirectionally transitioning" indicates that a voltage signal has both of a rising-transition and a falling-transition. For example, when a voltage level at the data output terminal QT bidirectionally transitions between the first voltage level and the second voltage level, the voltage level at the data output terminal QT may transition from the first voltage level to the second voltage level, and may also transition from the second voltage level to the first voltage level. In this case, the scan flip-flop circuit 1000 may allow the voltage level at the data output terminal QT to toggle between the first voltage level and the second voltage level.

The term "unidirectionally transitioning" indicates that the voltage signal has only one of the rising-transition and the falling-transition. For example, when the voltage level at the data output terminal QT unidirectionally transitions between the first voltage level and the second voltage level, the voltage level at the data output terminal QT may only transition from the first voltage level to the second voltage level, or may only transition from the second voltage level to the first voltage level. In this case, the scan flip-flop circuit 1000 may prevent the voltage level at the data output terminal QT from toggling between the first voltage level and the second voltage level.

In an example embodiment, the output unit 200 may generate the data output signal Q based on the intermediate signal IS and may provide the data output signal Q through the data output terminal QT in the first operation mode. The data output signal Q may be generated in synchronization with the clock signal CK. The output unit 200 may allow the voltage level of the data output terminal QT to bidirectionally transition between the first voltage level and the second voltage level and may allow the voltage level at the scan output terminal SQT to unidirectionally transition between the first voltage level and the second voltage level in the first operation mode.

In another example embodiment, the output unit 200 may generate the scan output signal SQ based on the intermediate signal IS and may provide the scan output signal SQ through the scan output terminal SQT in the second operation mode. The scan output signal SQ may be generated in synchronization with the clock signal CK. The output unit 200 may allow the voltage level of the scan output terminal SQT to bidirectionally transition between the first voltage level and the second voltage level and may allow the voltage level at the data output terminal QT to unidirectionally transition between the first voltage level and the second voltage level in the second operation mode.

In a scan test scheme, which is one of DFT schemes, a semiconductor device includes a plurality of scan flip-flop circuits. The plurality of scan flip-flop circuits is cascade-connected from a first scan flip-flop circuit to a last scan flip-flop circuit and forms a data path and a scan path. The semiconductor device may use the data path to perform a data transmission operation in a normal operation mode and may use the scan path to perform a test operation in a scan test mode. The data path may include a relatively large number of logic gates and may have a relatively high output load. The scan path may include a relatively small number of logic gates and the efficiency of the test operation may be affected by hold times of the scan flip-flop-circuits.

A conventional scan flip-flop circuit has a single output terminal. The conventional scan flip-flop circuit provides a data output signal through the output terminal in the normal operation mode and provides a scan output signal through the output terminal in the scan test mode. In a conventional semiconductor device including the conventional scan flip-flop circuit, a propagation delay and an output transition time of the logic gates included in the data path may be increase due to the complexity of the data path, and thus the operation speed of the conventional semiconductor device in the normal operation mode may be degraded. In addition, in the scan test mode, a voltage level of the scan path transitions between a power supply level and a ground voltage level and a voltage level of the data path may be varied since the scan path and the data path use the same output terminal. The variation of the voltage level of the data path causes a voltage drop in a power network of the semiconductor device and a variation of the hold time of the scan flip-flop-circuits. To increase the margin of the hold time of the scan flip-flop-circuits, the conventional semiconductor device needs additional buffers. However, the conventional semiconductor device may have relatively large power consumption due to the additional buffers and the conventional scan flip-flop circuit having the single output terminal.

In the scan flip-flop circuit 1000 according to some example embodiments, the output unit 200 includes two separated output terminals, that are the data output terminal QT and the scan output terminal SQT. The scan flip-flop circuit 1000 prevents the voltage level at one of the data output terminal QT and the scan output terminal SQT from toggling between the first voltage level and the second voltage level depending on the operation modes. Thus, the scan flip-flop circuit 1000 may effectively provide one of the data output signal Q and the scan output signal SQ depending on the operation modes.

In a semiconductor device including the scan flip-flop circuit 1000, a data path and a scan path are separated from each other. In the scan test mode, the variation of the voltage level of the data path and a voltage drop in a power network of the semiconductor device may be reduced. In addition, the variation of the hold time of the scan flip-flop-circuit 1000 may be reduced. Thus, the semiconductor device including the scan flip-flop circuit 1000 may have relatively high operation speed and low power consumption.

Figure 2:
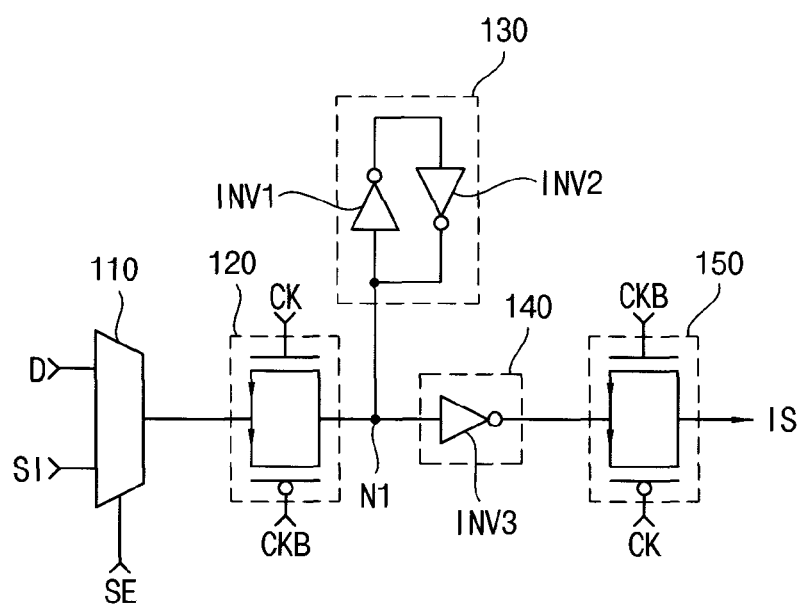
FIG. 2 is a circuit diagram illustrating an example of an input unit included in the scan flip-flop circuit of FIG. 1.

FIG. 2 is a circuit diagram illustrating an example of an input unit included in the scan flip-flop circuit of FIG. 1.

Referring to FIG. 2, the input unit 100*a* may include a selection unit 110, a first transmission gate 120, a latch unit 130, an inversion unit 140 and a second transmission gate 150.

The selection unit 110 may select one of the data input signal D and the scan input signal SI based on the scan enable signal SE to output the selected signal. The selection unit 110 may select the data input signal D in the first operation mode and may select the scan input signal SI in the second operation mode. For example, when the scan enable signal SE has the first logic level, the selection unit 110 may output the data input signal D. When the scan enable signal SE has the second logic level, the selection unit 110 may output the scan input signal SI.

The first transmission gate 120 may transmit an output signal of the selection unit 110 to a first node N1 in response to the clock signal CK. The first transmission gate 120 may include a first n-type metal oxide semiconductor (NMOS)

transistor and a first p-type metal oxide semiconductor (PMOS) transistor. The first NMOS transistor may have a gate electrode connected to the clock signal CK. The first PMOS transistor may have a gate electrode connected to an inverted signal CKB of the clock signal CK.

The latch unit 130 may latch a voltage at the first node N1. The latch unit 130 may include a first inverter INV1 and a second inverter INV2, where inputs and outputs of the inverters INV1 and INV2 are cross-coupled. An inversion unit 140 may invert the voltage at the first node N1 and may include a third inverter INV3.

A second transmission gate 150 may provide an output signal of the inversion unit 140 as the intermediate signal IS in response to the clock signal CK. A logic level of the intermediate signal IS may be opposite to a logic level of one of the input signals D and SI. The second transmission gate 150 may include a second NMOS transistor and a second PMOS transistor. The second NMOS transistor may have a gate electrode connected to the inverted clock signal CKB. The second PMOS transistor may have a gate electrode connected to the clock signal CK.

Since the first and second transmission gates 120 and 150 operate in response to the clock signal CK, the input unit 100a may generate the intermediate signal IS in synchronization with the clock signal CK. Thus, the output unit 200 included in the scan flip-flop circuit 1000 of FIG. 1 may also generate the data output signal Q or the scan output signal SQ in synchronization with the clock signal CK.

Figure 3:
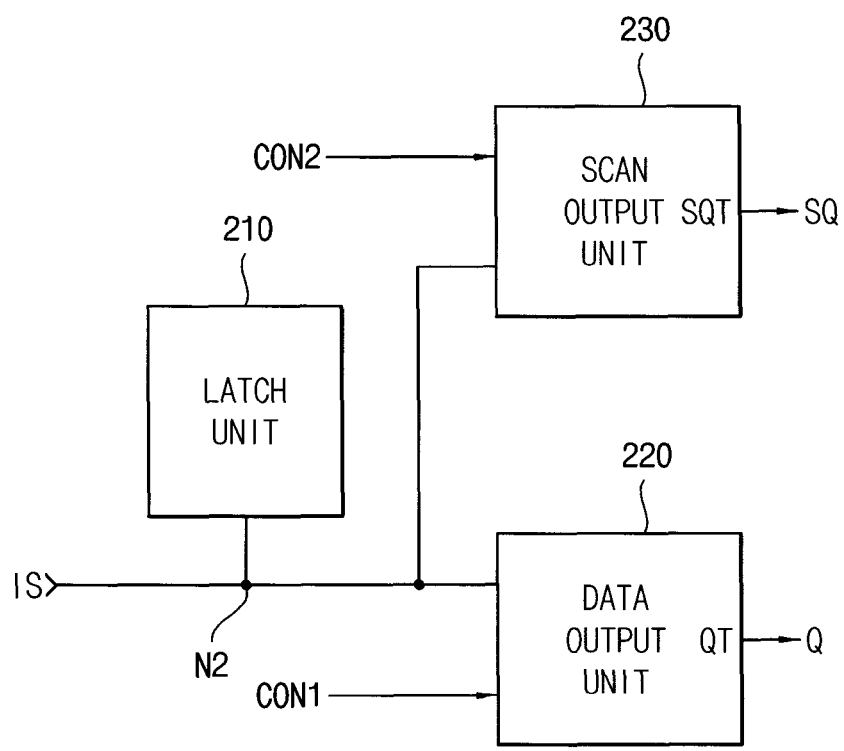
FIG. 3 is a block diagram illustrating an example of an output unit included in the scan flip-flop circuit of FIG. 1.

FIG. 3 is a block diagram illustrating an example of an output unit included in the scan flip-flop circuit of FIG. 1.

Referring to FIG. 3, the output unit 200a includes a latch unit 210, a data output unit 220 and a scan output unit 230.

The latch unit 210 may be connected to a latch node N2 to receive the intermediate signal IS and may latch the intermediate signal IS. The logic level of the intermediate signal IS may be opposite to the logic level of one of the input signals D and SI. For example, in the first operation mode, the intermediate signal IS may have the logic high level when the data input signal D has the logic low level. In the second operation mode, the intermediate signal IS may have the logic high level when the scan input signal SI has the logic low level.

The data output unit 220 may be connected to the latch node N2 to receive the intermediate signal IS and may receive a first control signal CON1 of the control signal CON from an external device (not shown) such as another semiconductor device or a semiconductor controller. The data output unit 220 may generate the data output signal Q based on the intermediate signal IS and the first control signal CON1 to provide the data output signal Q through the data output terminal QT in the first operation mode. For example, the data output signal Q may have a polarity that is the same as a polarity of the data input signal D. The voltage level at the data output terminal QT may bidirectionally transition between the first voltage level and the second voltage level in the first operation mode. The data output unit 220 may prevent the voltage level at the data output terminal QT from toggling based on the first control signal CON1 in the second operation mode. The voltage level at the data output terminal QT may unidirectionally transition between the first voltage level and the second voltage level in the second operation mode.

The scan output unit 230 may be connected to the latch node N2 to receive the intermediate signal IS and may receive a second control signal CON2 of the control signal CON from the external device. The scan output unit 230 may generate the scan output signal SQ based on the intermediate signal IS and the second control signal CON2 to provide the scan output signal SQ through the scan output terminal SQT in the second operation mode. For example, the scan output signal SQ may have a polarity that is the same as the polarity of the data output signal Q. The voltage level at the scan output terminal SQT may bidirectionally transition between the first voltage level and the second voltage level in the second operation mode. The scan output unit 230 may prevent the voltage level at the scan output terminal SQT from toggling based on the second control signal CON2 in the first operation mode. The voltage level at the scan output terminal SQT may unidirectionally transition between the first voltage level and the second voltage level in the first operation mode.

In an example embodiment, the first and second control signals CON1 and CON2 are the same or different from each other. For example, the first and second control signals CON1 and CON2 may be one of the scan enable signal SE and an inverted signal SEB of the scan enable signal SE.

Figure 4A:
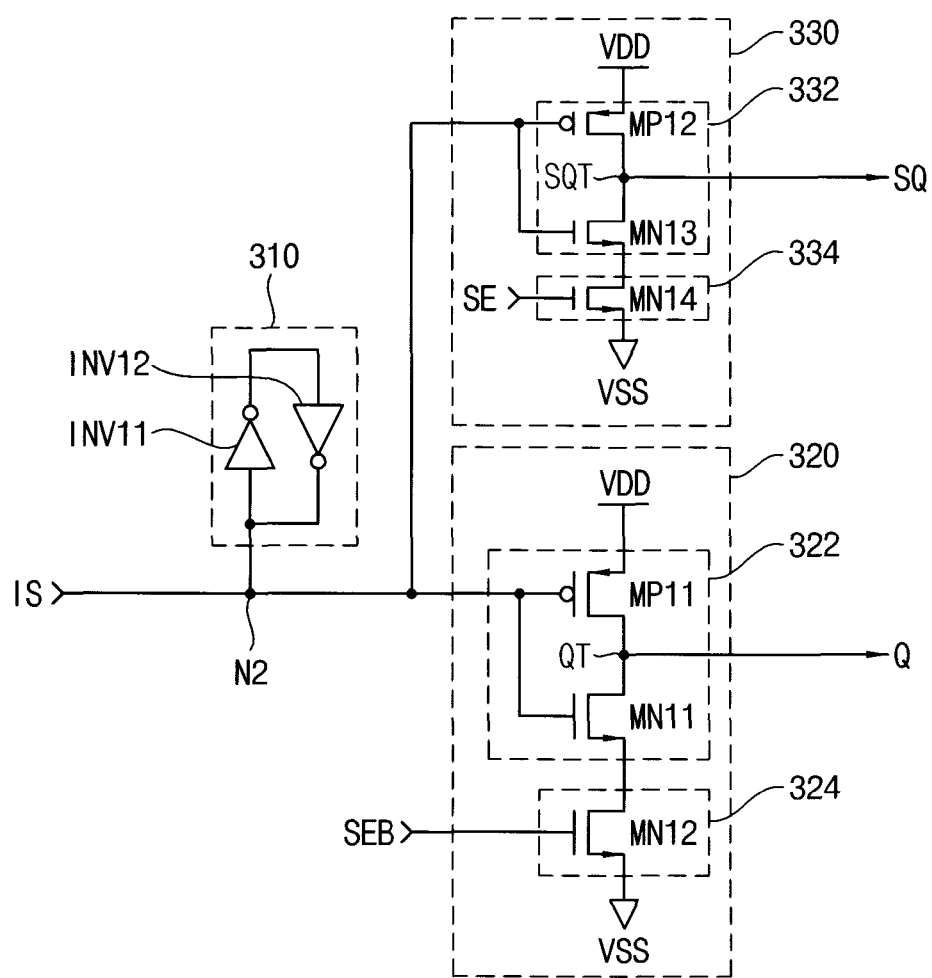
FIGS. 4A and 4B are circuit diagrams illustrating examples of the output unit of FIG. 3.
Figure 4B:
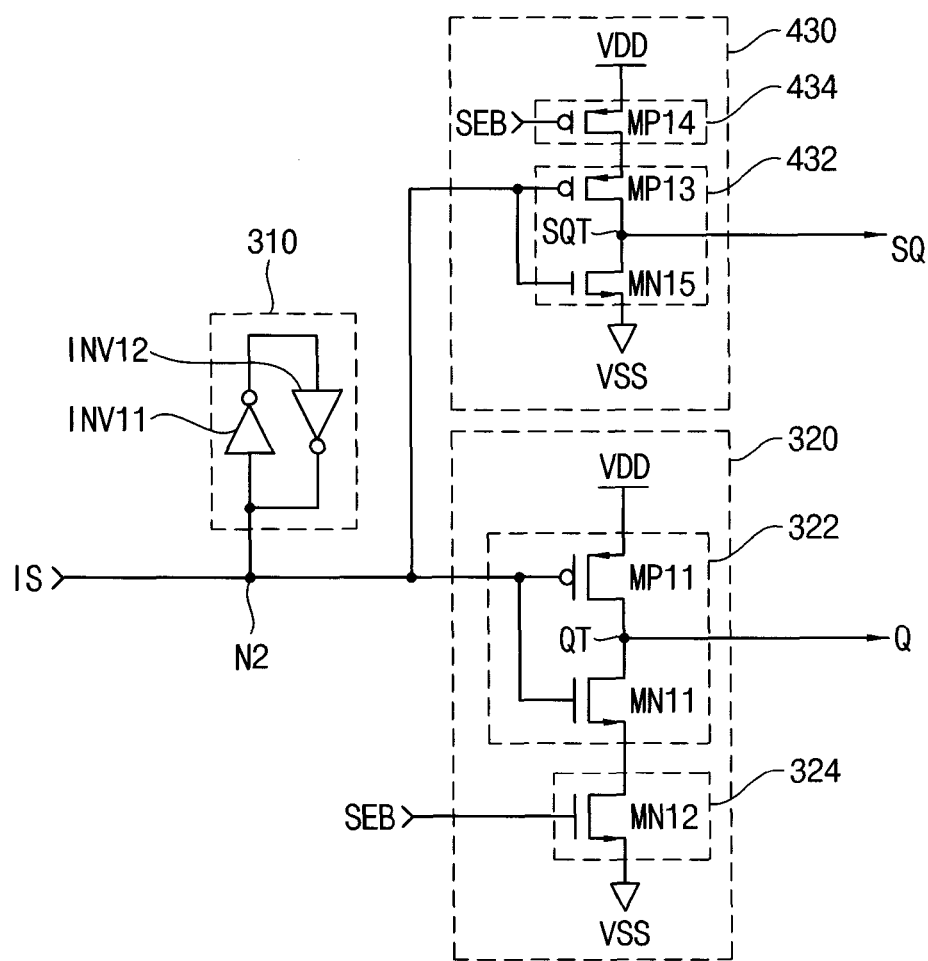

FIGS. 4A and 4B are circuit diagrams illustrating examples of the output unit of FIG. 3.

Referring to FIG. 4A, the output unit 300 may include a latch unit 310, a data output unit 320 and a scan output unit 330.

The latch unit 310 may include a first inverter INV11 and a second inverter INV12, where inputs and outputs of the inverters INV11 and INV12 are cross-coupled. The input of the first inverter INV11 and the output of the second inverter INV12 may be connected to the latch node N2. The latch unit 310 may latch the intermediate signal IS.

The data output unit 320 may include a first buffer unit 322 and a first power switching unit 324. The first buffer unit 322 may generate the data output signal Q based on the intermediate signal IS in the first operation mode. The first power switching unit 324 may activate the first buffer unit 322 in the first operation mode and may deactivate the first buffer unit 322 in the second operation mode in response to the inverted scan enable signal SEB. For example, the first power switching unit 324 may apply a ground voltage VSS to the first buffer unit 322 in the first operation mode and may not apply the ground voltage VSS to the first buffer unit 322 in the second operation mode, and thus the voltage level at the data output terminal QT may be controlled. In this case, the first control signal CON1 may be the inverted scan enable signal SEB.

The first buffer unit 322 may be implemented with a first inverter that includes a first PMOS transistor MP11 and a first NMOS transistor MN11. The first PMOS transistor MP11 may include a first electrode (e.g., a source) connected to a power supply voltage VDD, a gate electrode connected to the intermediate signal IS, and a second electrode (e.g., a drain) connected to the data output terminal QT. The first NMOS transistor MN11 may include a first electrode (e.g., a drain) connected to the data output terminal QT, a gate electrode connected to the intermediate signal IS, and a second electrode (e.g., a source).

The first power switching unit 324 may include a first switching transistor MN12. The first switching transistor MN12 may be a NMOS transistor and may include a first electrode (e.g., a drain) connected to the second electrode of the first NMOS transistor MN11, a gate electrode connected to the inverted scan enable signal SEB, and a second electrode (e.g., a source) connected to the ground voltage VSS.

The scan output unit 330 may include a second buffer unit 332 and a second power switching unit 334. The second buffer unit 332 may generate the scan output signal SQ based on the intermediate signal IS in the second operation mode. The second power switching unit 334 may activate the second buffer unit 332 in the second operation mode and may deactivate the second buffer unit 332 in the first operation mode in response to the scan enable signal SE. For example, the second power switching unit 334 may apply the ground voltage VSS to the second buffer unit 332 in the second operation mode and may not apply the ground voltage VSS to the second buffer unit 332 in the first operation mode, and thus the voltage level at the scan output terminal SQT may be controlled. In this case, the second control signal CON2 may be the scan enable signal SE and the first and second control signals CON1 and CON2 may be different from each other.

The second buffer unit 332 may be implemented with a second inverter that includes a second PMOS transistor MP12 and a second NMOS transistor MN13. The second PMOS transistor MP12 may include a first electrode (e.g., a source) connected to the power supply voltage VDD, a gate electrode connected to the intermediate signal IS, and a second electrode (e.g., a drain) connected to the scan output terminal SQT. The second NMOS transistor MN13 may include a first electrode (e.g., a drain) connected to the scan output terminal SQT, a gate electrode connected to the intermediate signal IS, and a second electrode (e.g., a source).

The second power switching unit 334 may include a second switching transistor MN14. The second switching transistor MN14 may be a NMOS transistor and may include a first electrode (e.g., a drain) connected to the second electrode of the second NMOS transistor MN13, a gate electrode connected to the scan enable signal SE, and a second electrode (e.g., a source) connected to the ground voltage VSS.

In an example embodiment, sizes of the transistors MP12, MN13 and MN14 included in the scan output unit 330 may be smaller than sizes of the transistors MP11, MN11 and MN12 included in the data output unit 320 since the scan path of the semiconductor device having the scan function is less structurally complex than the data path of the semiconductor device.

Hereinafter, operations of the output unit 300 depending on the operation modes will be described with reference to FIG. 4A.

In the first operation mode (e.g., the normal operation mode), the inverted scan enable signal SEB has a logic high level and the scan enable signal SE has a logic low level. The first switching transistor MN12 is turned on and the ground voltage VSS is applied to the first buffer unit 322. Thus, the first buffer unit 322 is activated. The data output unit 320 provides the data output signal Q through the data output terminal QT and the voltage level at the data output terminal QT bidirectionally transitions between the power supply voltage VDD level and the ground voltage VSS level. The second switching transistor MN14 is turned off and the ground voltage VSS is not applied to the second buffer unit 332. Thus, the second buffer unit 332 is deactivated. The voltage level at the scan output terminal SQT unidirectionally transitions between the power supply voltage VDD level and the ground voltage VSS level. For example, the voltage level at the scan output terminal SQT may transition from the ground voltage VSS level to the power supply voltage VDD level but may not transition from the power supply voltage VDD level to the ground voltage VSS level.

In the second operation mode (e.g., the scan test mode), the inverted scan enable signal SEB has the logic low level and the scan enable signal SE has the logic high level. The second switching transistor MN14 is turned on and the ground voltage VSS is applied to the second buffer unit 332. Thus, the second buffer unit 332 is activated. The scan output unit 330 provides the scan output signal SQ through the scan output terminal SQT and the voltage level at the scan output terminal SQT bidirectionally transitions between the power supply voltage VDD level and the ground voltage VSS level. The first switching transistor MN12 is turned off and the ground voltage VSS is not applied to the first buffer unit 322. Thus, the first buffer unit 332 is deactivated. The voltage level at the data output terminal QT unidirectionally transitions between the power supply voltage VDD level and the ground voltage VSS level. For example, the voltage level at the data output terminal QT may transition from the ground voltage VSS level to the power supply voltage VDD level but may not transition from the power supply voltage VDD level to the ground voltage VSS level.

Referring to FIG. 4B, the output unit 400 may include the latch unit 310, the data output unit 320 and a scan output unit 430. The latch unit 310 and the data output unit 320 in FIG. 4B are the same as the latch unit 310 and data output unit 320 in FIG. 4A, respectively. Thus, in FIG. 4B, the same reference numerals will be used to refer the same or like elements in FIG. 4A.

The scan output unit 430 may include a second buffer unit 432 and a second power switching unit 434. The second buffer unit 432 may generate the scan output signal SQ based on the intermediate signal IS in the second operation mode. The second power switching unit 434 may activate the second buffer unit 432 in the second operation mode and may deactivate the second buffer unit 432 in the first operation mode in response to the inverted scan enable signal SEB. For example, the second power switching unit 434 may apply the power supply voltage VDD to the second buffer unit 432 in the second operation mode and may not apply the power supply voltage VDD to the second buffer unit 432 in the first operation mode, and thus the voltage level at the scan output terminal SQT may be controlled. In this case, the second control signal CON2 may be the inverted scan enable signal SEB. The first and second control signals CON1 and CON2 are the same, and thus the scan flip-flop circuit 1000 including the output unit 400 of FIG. 4B may have relatively small size.

The second power switching unit 434 may include a second switching transistor MP14. The second switching transistor MP14 may be a PMOS transistor and may include a first electrode (e.g., a source) connected to the power supply voltage VDD, a gate electrode connected to the inverted scan enable signal SEB, and a second electrode (e.g., a drain).

The second buffer unit 432 may be implemented with a second inverter that includes a second PMOS transistor MP13 and a second NMOS transistor MN15. The second PMOS transistor MP13 may include a first electrode (e.g., a source) connected to the second electrode of the second switching transistor MP14, a gate electrode connected to the intermediate signal IS, and a second electrode (e.g., a drain) connected to the scan output terminal SQT. The second NMOS transistor MN15 may include a first electrode (e.g., a drain) connected to the scan output terminal SQT, a gate electrode connected to the intermediate signal IS, and a second electrode (e.g., a source) connected to the ground voltage VSS.

Hereinafter, operations of the output unit 400 depending on the operation modes will be described with reference to FIG. 4B.

The operations of the data output unit 320 of FIG. 4B are the same as the operations of the data output unit 320 of FIG. 4A. The inverted scan enable signal SEB has the logic high level in the first operation mode and has the logic low level in the second operation mode. In the first operation mode, the second switching transistor MP14 is turned off and the power supply voltage VDD is not applied to the second buffer unit 432. Thus, the second buffer unit 432 is deactivated. The voltage level at the scan output terminal SQT unidirectionally transitions between the power supply voltage VDD level and the ground voltage VSS level. For example, the voltage level at the scan output terminal SQT may transition from the power supply voltage VDD level to the ground voltage VSS level but may not transition from the ground voltage VSS level to the power supply voltage VDD level. In the second operation mode, the second switching transistor MP14 is turned on and the power supply voltage VDD is applied to the second buffer unit 432. Thus, the second buffer unit 432 is activated. The scan output unit 430 provides the scan output signal SQ through the scan output terminal SQT and the voltage level at the scan output terminal SQT bidirectionally transitions between the power supply voltage VDD level and the ground voltage VSS level.

Figure 5:
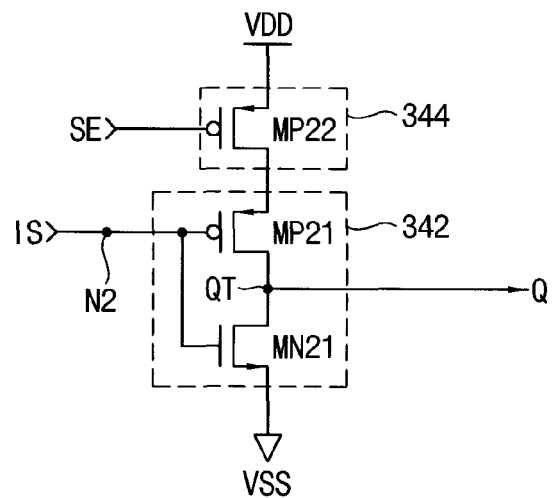
FIG. 5 is a circuit diagram illustrating an example of a data output unit included in the output unit of FIG. 3.

FIG. 5 is a circuit diagram illustrating an example of a data output unit included in the output unit of FIG. 3. The data output unit 320 of FIGS. 4A and 4B may be replaced with the data output unit 340 of FIG. 5.

Referring to FIG. 5, the data output unit 340 may include a first buffer unit 342 and a first power switch unit 344.

The first power switching unit 344 may include a first switching transistor MP22. The first switching transistor MP22 may be a PMOS transistor and may include a first electrode (e.g., a source) connected to the power supply voltage VDD, a gate electrode connected to the scan enable signal SE, and a second electrode (e.g., a drain). The first buffer unit 342 may include a first PMOS transistor MP21 and a first NMOS transistor MN21 that are connected between the second electrode of the first switching transistor MP22 and the ground voltage VSS in serial. Each of the transistors MP21 and MN21 has a gate electrode connected to the intermediate signal IS.

In some example embodiments, the data output unit 320 in FIGS. 4A and 4B may be replaced with the data output unit 340 of FIG. 5. In this case, the scan enable signal SE has the logic low level in the first operation mode and has the logic high level in the second operation mode. In the first operation mode, the first switching transistor MP22 is turned on and the power supply voltage VDD is applied to the first buffer unit 342. Thus, the first buffer unit 342 is activated. The data output unit 340 provides the data output signal Q through the data output terminal QT and the voltage level at the data output terminal QT bidirectionally transitions between the power supply voltage VDD level and the ground voltage VSS level. In the second operation mode, the first switching transistor MP22 is turned off and the power supply voltage VDD is not applied to the first buffer unit 342. Thus, the first buffer unit 342 is deactivated. The voltage level at the data output terminal QT unidirectionally transitions between the power supply voltage VDD level and the ground voltage VSS level. For example, the voltage level at the data output terminal QT may transition from the power supply voltage VDD level to the ground voltage VSS level but may not transition from the ground voltage VSS level to the power supply voltage VDD level.

Figure 6:
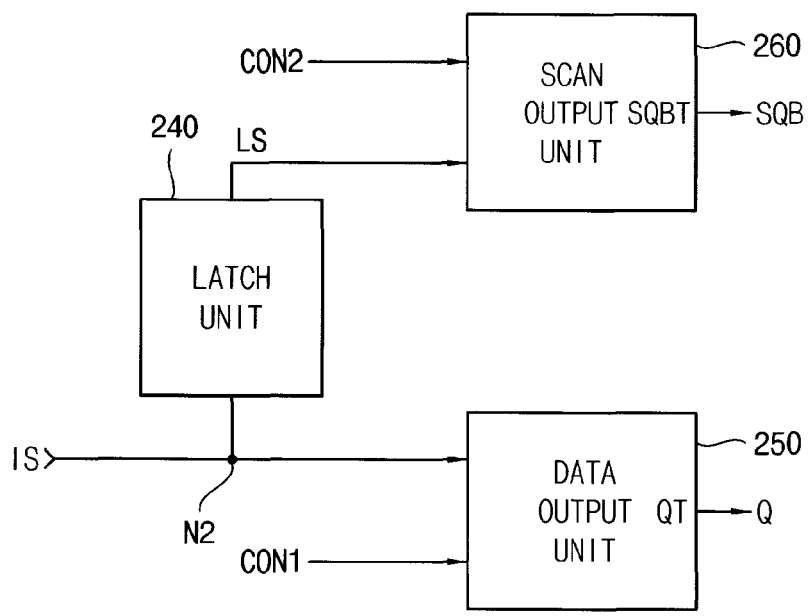
FIG. 6 is a block diagram illustrating another example of the output unit included in the scan flip-flop circuit of FIG. 1.

FIG. 6 is a block diagram illustrating another example of the output unit included in the scan flip-flop circuit of FIG. 1.

Referring to FIG. 6, the output unit 200b includes a latch unit 240, a data output unit 250 and a scan output unit 260.

The latch unit 240 may be connected to a latch node N2 to receive the intermediate signal IS and may latch the intermediate signal IS to generate a latch signal LS. The logic level of the intermediate signal IS may be opposite to the logic level of one of the input signals D and SI.

The data output unit 250 is the same as the data output unit 220 in FIG. 3. The data output unit 250 may be connected to the latch node N2 to receive the intermediate signal IS and may receive a first control signal CON1 from an external device (not shown). The data output unit 250 may generate the data output signal Q based on the intermediate signal IS and the first control signal CON1 to provide the data output signal Q through the data output terminal QT in the first operation mode. The data output unit 250 may prevent the voltage level at the data output terminal QT from toggling based on the first control signal CON1 in the second operation mode.

The scan output unit 260 may be connected to the latch unit 240 to receive the latch signal LS and may receive a second control signal CON2 from the external device. The scan output unit 260 may generate the scan output signal SQB based on the latch signal LS and the second control signal CON2 to provide the scan output signal SQB through the scan output terminal SQBT in the second operation mode. For example, a polarity of the scan output signal SQB may be opposite to the polarity of the data output signal Q. The voltage level at the scan output terminal SQBT may bidirectionally transition between the first voltage level and the second voltage level in the second operation mode. The scan output unit 260 may prevent the voltage level at the scan output terminal SQBT from toggling based on the second control signal CON2 in the first operation mode. The voltage level at the scan output terminal SQBT may unidirectionally transition between the first voltage level and the second voltage level in the first operation mode.

Figure 7A:
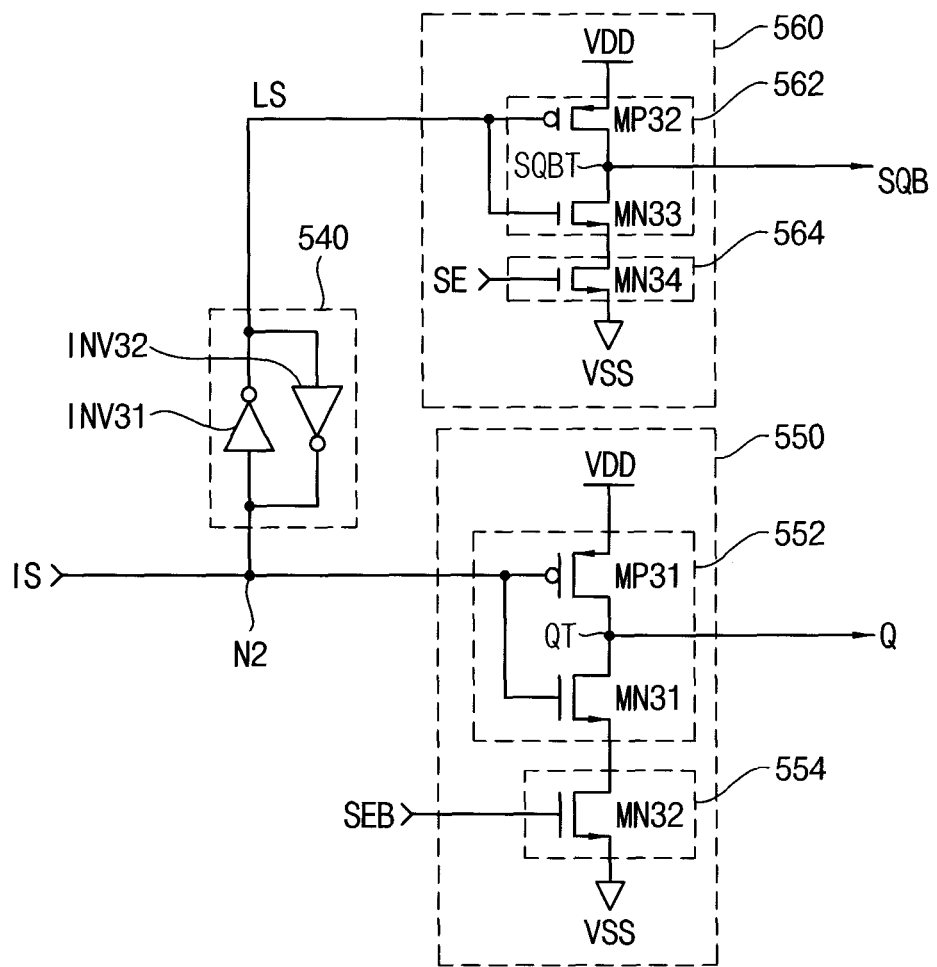
FIGS. 7A and 7B are circuit diagrams illustrating examples of the output unit of FIG. 6.
Figure 7B:
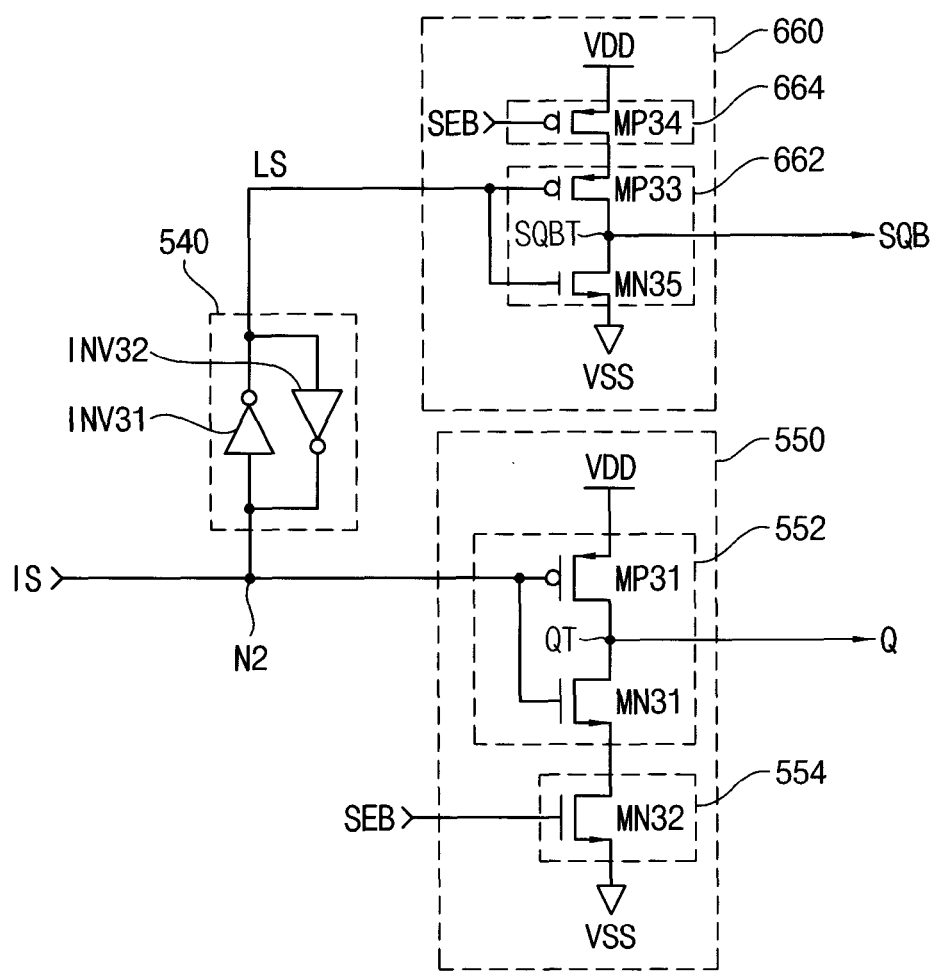

FIGS. 7A and 7B are circuit diagrams illustrating examples of the output unit of FIG. 6.

Referring to FIG. 7A, the output unit 500 may include a latch unit 540, a data output unit 550 and a scan output unit 560.

The latch unit 540 may include a first inverter INV31 and a second inverter INV32, where inputs and outputs of the inverters INV31 and INV32 are cross-coupled. The input of the first inverter INV31 and the output of the second inverter INV32 may be connected to the latch node N2. The latch unit 540 may latch the intermediate signal IS to generate the latch signal LS.

The data output unit 550 may include a first buffer unit 552 and a first power switching unit 554. The first buffer unit 552 may generate the data output signal Q based on the intermediate signal IS in the first operation mode. The first power switching unit 554 may activate the first buffer unit 552 in the first operation mode and may deactivate the first buffer unit 552 in the second operation mode in response to the inverted scan enable signal SEB. The first buffer unit 552 may be implemented with a first inverter that includes a first PMOS transistor MP31 and a first NMOS transistor MN31. The first power switching unit 554 may include a first switching transistor MN32.

The scan output unit 560 may include a second buffer unit 562 and a second power switching unit 564. The second buffer unit 562 may generate the scan output signal SQB based on the latch signal LS in the second operation mode. The second power switching unit 564 may activate the second buffer unit 562 in the second operation mode and may deactivate the second buffer unit 562 in the first operation mode in response to the scan enable signal SE. For example, the second power switching unit 564 may apply the ground voltage VSS to the second buffer unit 562 in the second operation mode and may not apply the ground voltage VSS to the second buffer unit 562 in the first operation mode.

The second buffer unit 562 may be implemented with a second inverter that includes a second PMOS transistor MP32 and a second NMOS transistor MN33. The second PMOS transistor MP32 may include a first electrode (e.g., a source) connected to the power supply voltage VDD, a gate electrode connected to the latch signal LS, and a second electrode (e.g., a drain) connected to the scan output terminal SQBT. The second NMOS transistor MN33 may include a first electrode (e.g., a drain) connected to the scan output terminal SQBT, a gate electrode connected to the latch signal LS, and a second electrode (e.g., a source).

The second power switching unit 564 may include a second switching transistor MN34. The second switching transistor MN34 may be a NMOS transistor and may include a first electrode (e.g., a drain) connected to the second electrode of the second NMOS transistor MN33, a gate electrode connected to the scan enable signal SE, and a second electrode (e.g., a source) connected to the ground voltage VSS.

Referring to FIG. 7B, the output unit 600 may include a latch unit 540, a data output unit 550 and a scan output unit 660. The latch unit 540 and the data output unit 550 in FIG. 7B are the same as the latch unit 540 and the data output unit 550 in FIG. 7A, respectively. Thus, in FIG. 7B, the same reference numerals will be used to refer the same or like elements in FIG. 7A.

The scan output unit 660 may include a second buffer unit 662 and a second power switching unit 664. The second buffer unit 662 may generate the scan output signal SQBT6 based on the latch signal LS in the second operation mode. The second power switching unit 664 may activate the second buffer unit 662 in the second operation mode and may deactivate the second buffer unit 662 in the first operation mode in response to the inverted scan enable signal SEB. For example, the second power switching unit 664 may apply the power supply voltage VDD to the second buffer unit 662 in the second operation mode and may not apply the power supply voltage VDD to the second buffer unit 662 in the first operation mode.

The second power switching unit 664 may include a second switching transistor MP34. The second switching transistor MP34 may be a PMOS transistor and may include a first electrode (e.g., a source) connected to the power supply voltage VDD, a gate electrode connected to the inverted scan enable signal SEB, and a second electrode (e.g., a drain).

The second buffer unit 662 may be implemented with a second inverter that includes a second PMOS transistor MP33 and a second NMOS transistor MN35. The second PMOS transistor MP33 may include a first electrode (e.g., a source) connected to the second electrode of the second switching transistor MP34, a gate electrode connected to the latch signal LS, and a second electrode (e.g., a drain) connected to the scan output terminal SQBT. The second NMOS transistor MN35 may include a first electrode (e.g., a drain) connected to the scan output terminal SQBT, a gate electrode connected to the latch signal LS, and a second electrode (e.g., a source) connected to the ground voltage VSS.

In some example embodiments, the data output unit 550 in FIGS. 7A and 7B may be replaced with the data output unit 340 of FIG. 5.

As described above, the output units 300, 400, 500 and 600 may include two separated output terminals, that are the data output terminal and the scan output terminal. The scan flip-flop circuit 1000 including one of the output units according to some example embodiments may prevent the voltage level at one of the data output terminal and the scan output terminal from toggling between the first voltage level and the second voltage level depending on the operation modes. Thus, the scan flip-flop circuit 1000 may effectively provide one of the data output signal and the scan output signal depending on the operation modes.

Figure 8:
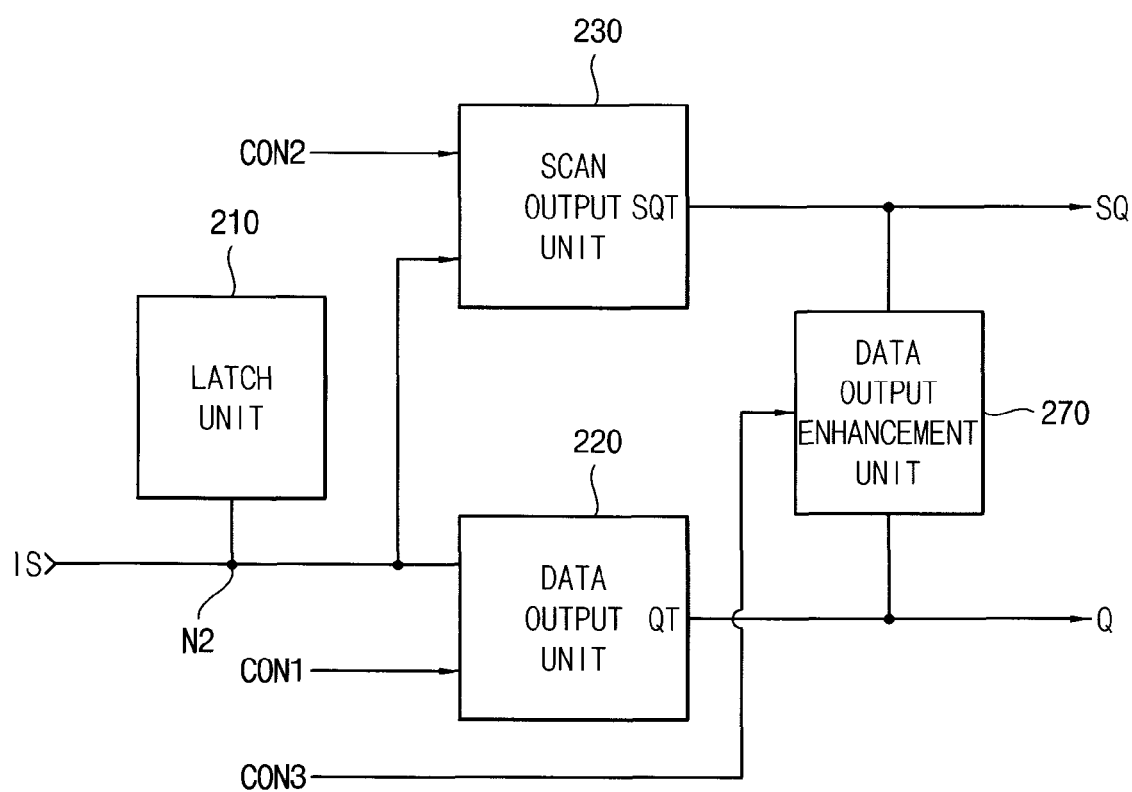
FIG. 8 is a block diagram illustrating still another example of the output unit included in the scan flip-flop circuit of FIG. 1.

FIG. 8 is a block diagram illustrating still another example of the output unit included in the scan flip-flop circuit of FIG. 1.

Referring to FIG. 8, the output unit 200c includes the latch unit 210, the data output unit 220, the scan output unit 230 and a data output enhancement unit 270.

The latch unit 210, the data output unit 220 and the scan output unit 230 in FIG. 8 are the same as the latch unit 210, the data output unit 220 and the scan output unit 230 in FIG. 3, respectively. Thus, in FIG. 8, the same reference numerals will be used to refer the same or like elements in FIG. 3.

The data output enhancement unit 270 may be connected between the data output terminal QT and the scan output terminal SQT to enhance the data output signal Q based on a third control signal CON3 of the control signal CON in the first operation mode. For example, the data output enhancement unit 270 may electrically connect the scan output terminal SQT with the data output terminal QT based on the third control signal CON3 in the first operation mode. The data output enhancement unit 270 may be disabled based on the third control signal CON3 in the second operation mode. For example, the data output enhancement unit 270 may electrically disconnect the scan output terminal SQT with the data output terminal QT based on the third control signal CON3 in the second operation mode.

Although the output unit 200a of FIG. 3 includes the second power switching unit that is included in the scan output unit 230 and selectively deactivates the scan output unit 230, the scan output unit 230 may have leakage current flowing through the scan output terminal SQT in the first operation mode. The output unit 200c of FIG. 8 further includes the data output enhancement unit 270, thereby enhancing the current of the data output signal Q and the drivability of the scan flip-flop circuit 1000 including the output unit 200c in the first operation mode.

Figure 9A:
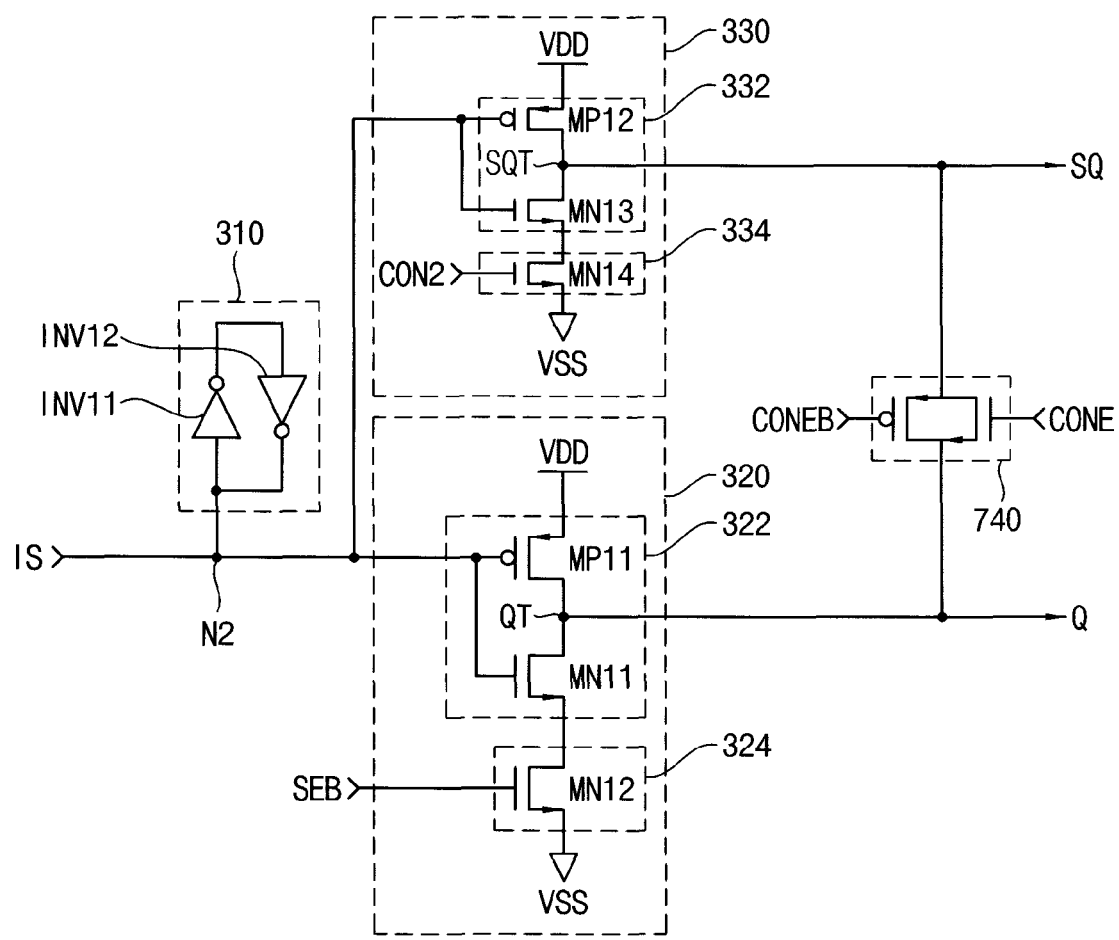
FIGS. 9A and 9B are circuit diagrams illustrating examples of the output unit of FIG. 8.
Figure 9B:
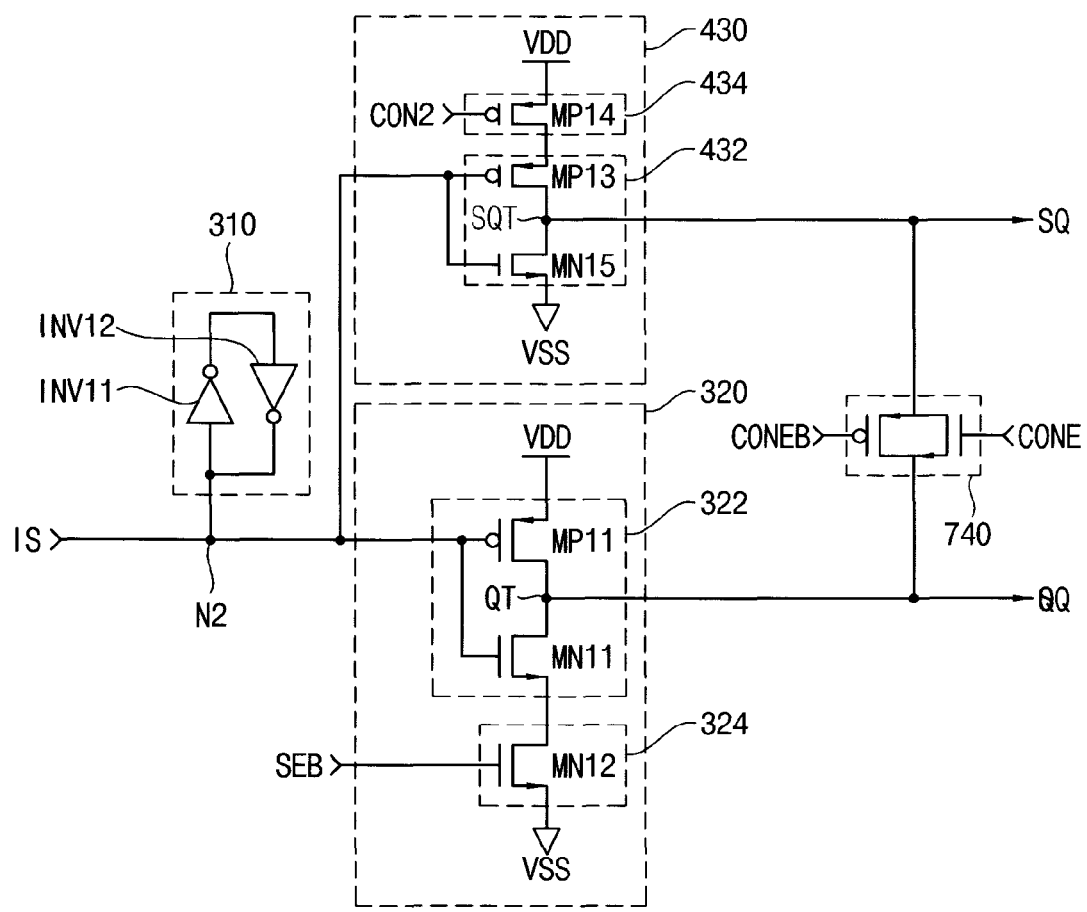

FIGS. 9A and 9B are circuit diagrams illustrating examples of the output unit of FIG. 8.

Referring to FIG. 9A, the output unit 700 may include a latch unit 310, a data output unit 320, a scan output unit 330 and a data output enhancement unit 740.

The latch unit 310, the data output unit 320 and the scan output unit 330 in FIG. 9A are the same as the latch unit 310, the data output unit 320 and the scan output unit 330 in FIG. 4A, respectively. Thus, in FIG. 9A, the same reference numerals will be used to refer the same or like elements in FIG. 4A.

The data output enhancement unit 740 may be implemented with a transmission gate that is connected between the data output terminal QT and the scan output terminal SQT because the polarity of the data output signal Q is the same as the polarity of the scan output signal SQ. The transmission gate may allow current flowing through the scan output terminal SQT to bypass the data output terminal QT to enhance the data output signal Q based on the output enhancement control signal CONE in the first operation mode and may electrically disconnect the scan output terminal SQT with the data output terminal QT based on the output enhancement control signal CONE in the second operation mode.

The transmission gate may include a first transfer transistor and a second transfer transistor. The first transfer transistor may be a NMOS transistor and may have a gate electrode that is connected to an output enhancement control signal CONE. The second transfer transistor may be a PMOS transistor and may have a gate electrode that is connected to an inverted signal CONEB of the output enhancement control signal CONE. In this case, the third control signal CON3 may be the output enhancement control signal CONE.

In an example embodiment, sizes of the transfer transistors included in the data output enhancement unit 740 are the same as sizes of the transistors MP11, MN11 and MN12 included in the data output unit 320.

In an example embodiment, the second control signal CON2 applied to the scan output unit 330 may be the scan enable signal SE. In another example embodiment, the second control signal CON2 may be generated by performing an OR operation on the scan enable signal SE and the output enhancement control signal CONE.

Hereinafter, operations of the data output enhancement unit 740 depending on the operation modes will be described with reference to FIG. 9A.

In the first operation mode, the output enhancement control signal CONE has the logic high level and the inverted output enhancement control signal CONEB has the logic low level. The transmission gate is turned on and the current flowing through the scan output terminal SQT bypasses the data output terminal QT through the transmission gate to enhance the data output signal Q. In the second operation mode, the output enhancement control signal CONE has the logic low level and the inverted output enhancement control signal CONEB has the logic high level. The transmission gate is turned off and the output unit 700 provides the scan output signal SQ through the scan output terminal SQT.

Referring to FIG. 9B, the output unit 800 may include the latch unit 310, the data output unit 320, the scan output unit 430 and the data output enhancement unit 740.

The latch unit 310, the data output unit 320 and the scan output unit 430 in FIG. 9B are the same as the latch unit 310, the data output unit 320 and the scan output unit 430 in FIG. 4B, respectively. In addition, the data output enhancement unit 740 in FIG. 9B is the same as the data output enhancement unit 740 in FIG. 9A. Thus, in FIG. 9B, the same reference numerals will be used to refer the same or like elements in FIGS. 4B and 9A.

In an example embodiment, the second control signal CON2 applied to the scan output unit 430 may be the inverted scan enable signal SEB. In another example embodiment, the second control signal CON2 may be generated by performing an OR operation on the scan enable signal SE and the output enhancement control signal CONE and by inverting the signal generated based on the OR operation.

Figure 10:
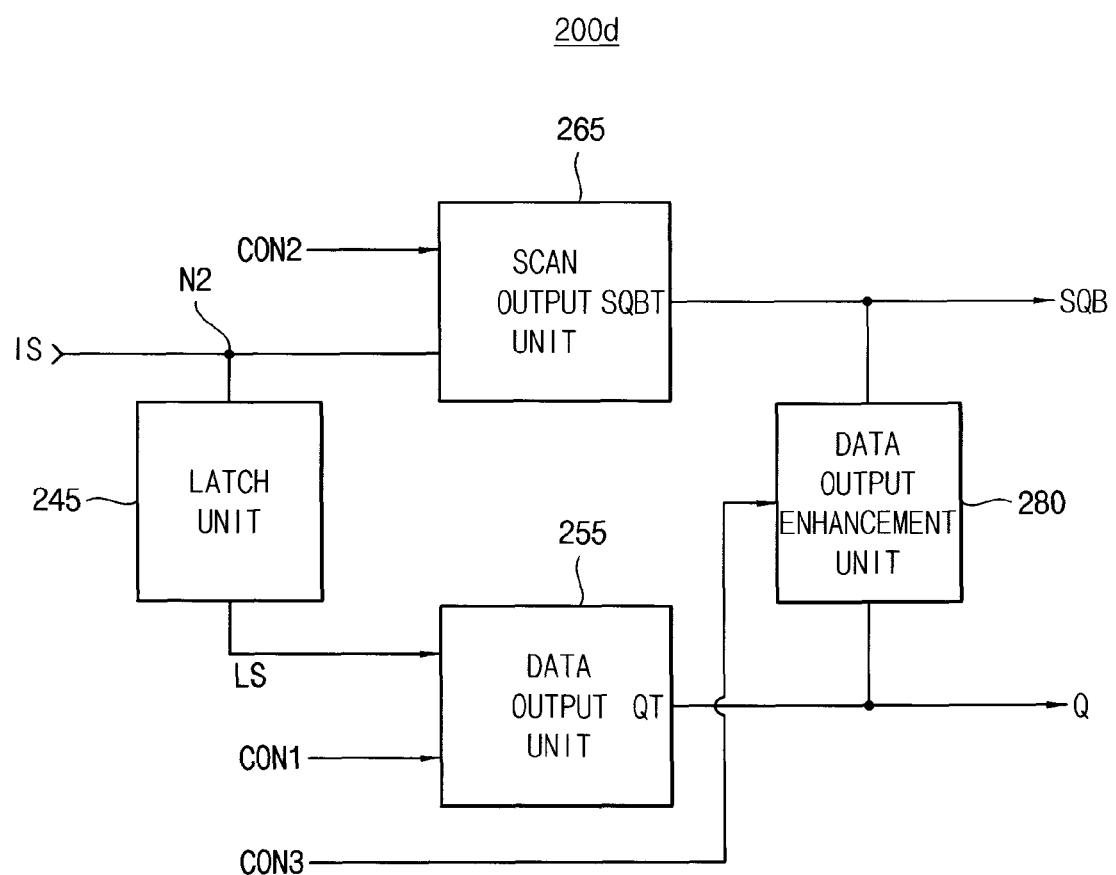
FIG. 10 is a block diagram illustrating still another example of the output unit included in the scan flip-flop circuit of FIG. 1.

FIG. 10 is a block diagram illustrating still another example of the output unit included in the scan flip-flop circuit of FIG. 1.

Referring to FIG. 10, the output unit 200d includes a latch unit 245, a data output unit 255, a scan output unit 265 and a data output enhancement unit 280.

The latch unit 245 may be connected to a latch node N2 to receive the intermediate signal IS and may latch the intermediate signal IS to generate a latch signal LS. In this case, the logic level of the intermediate signal IS may be the same as the logic level of one of the input signals D and SI. Therefore, an input unit that generates the intermediate signal IS in FIG. 10 is the same as the input unit 100a except the input unit that generates the intermediate signal IS in FIG. 10 does not include the inversion unit 140. For example, in the first operation mode, the intermediate signal IS may have the logic high level when the data input signal D has the logic high level. In the second operation mode, the intermediate signal IS may have the logic high level when the scan input signal SI has the logic high level.

The data output unit 255 may be connected to the latch unit 245 to receive the latch signal IS and may receive a first control signal CON1 from an external device (not shown). The data output unit 255 may generate the data output signal Q based on the latch signal LS and the first control signal CON1 to provide the data output signal Q through the data output terminal QT in the first operation mode. The data output unit 255 may prevent the voltage level at the data output terminal QT from toggling based on the first control signal CON1 in the second operation mode.

The scan output unit 265 may be connected to the latch node N2 to receive the intermediate signal IS and may receive a second control signal CON2 from the external device. The scan output unit 265 may generate the scan output signal SQB based on the intermediate signal IS and the second control signal CON2 to provide the scan output signal SQB through the scan output terminal SQBT in the second operation mode. The scan output unit 265 may prevent the voltage level at the scan output terminal SQBT from toggling based on the second control signal CON2 in the first operation mode.

The data output enhancement unit 280 may be connected between the data output terminal QT and the scan output terminal SQBT to enhance the data output signal Q based on a third control signal CON3 of the control signal CON in the first operation mode. For example, the data output enhancement unit 280 may provide an additional current to the data output terminal QT based on the third control signal CON3 and the voltage level at the scan output terminal SQBT in the first operation mode. The data output enhancement unit 280 may be disabled based on the third control signal CON3 in the second operation mode.

Figure 11A:
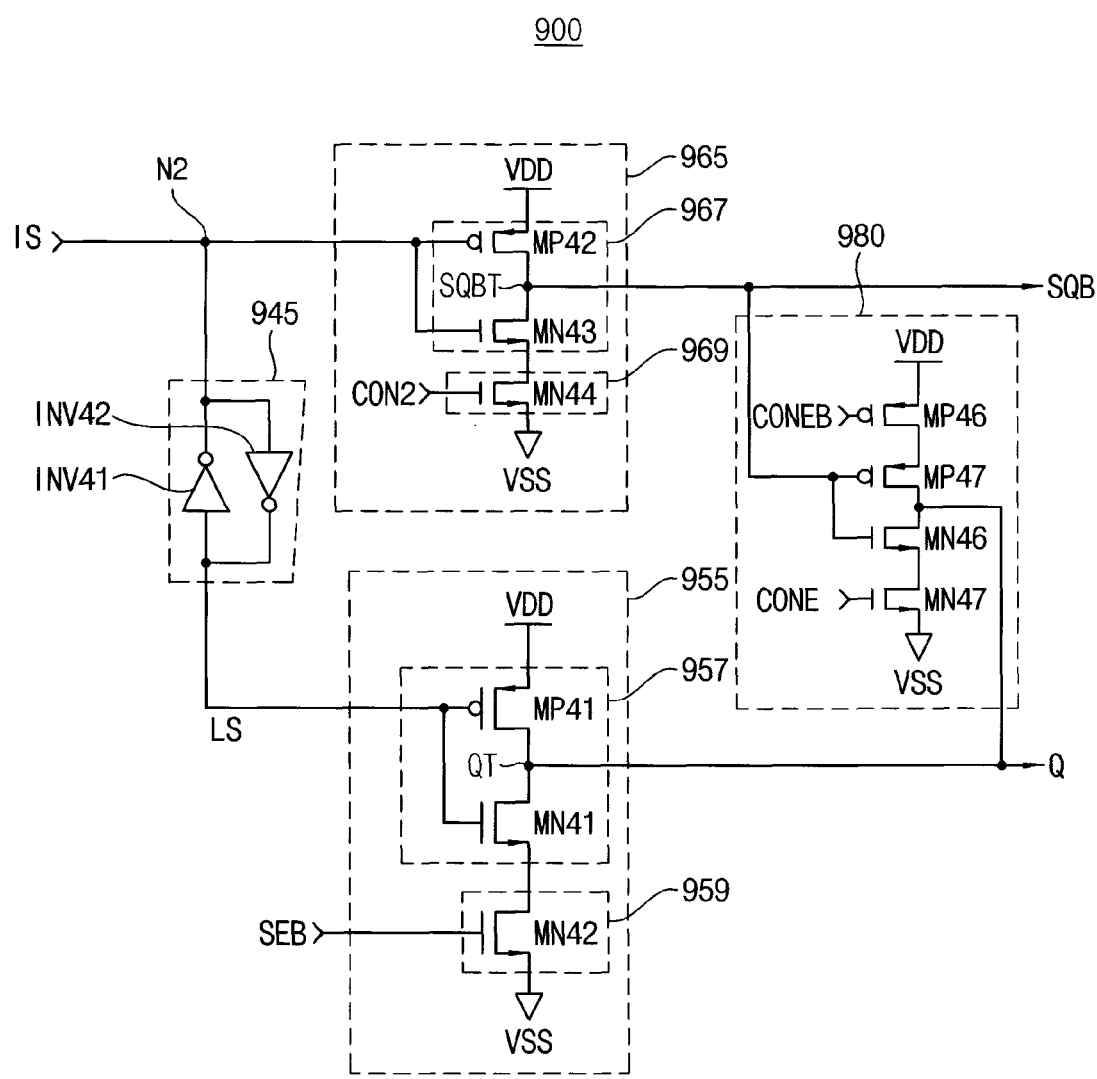
FIGS. 11A and 11B are circuit diagrams illustrating examples of the output unit of FIG. 10.
Figure 11B:
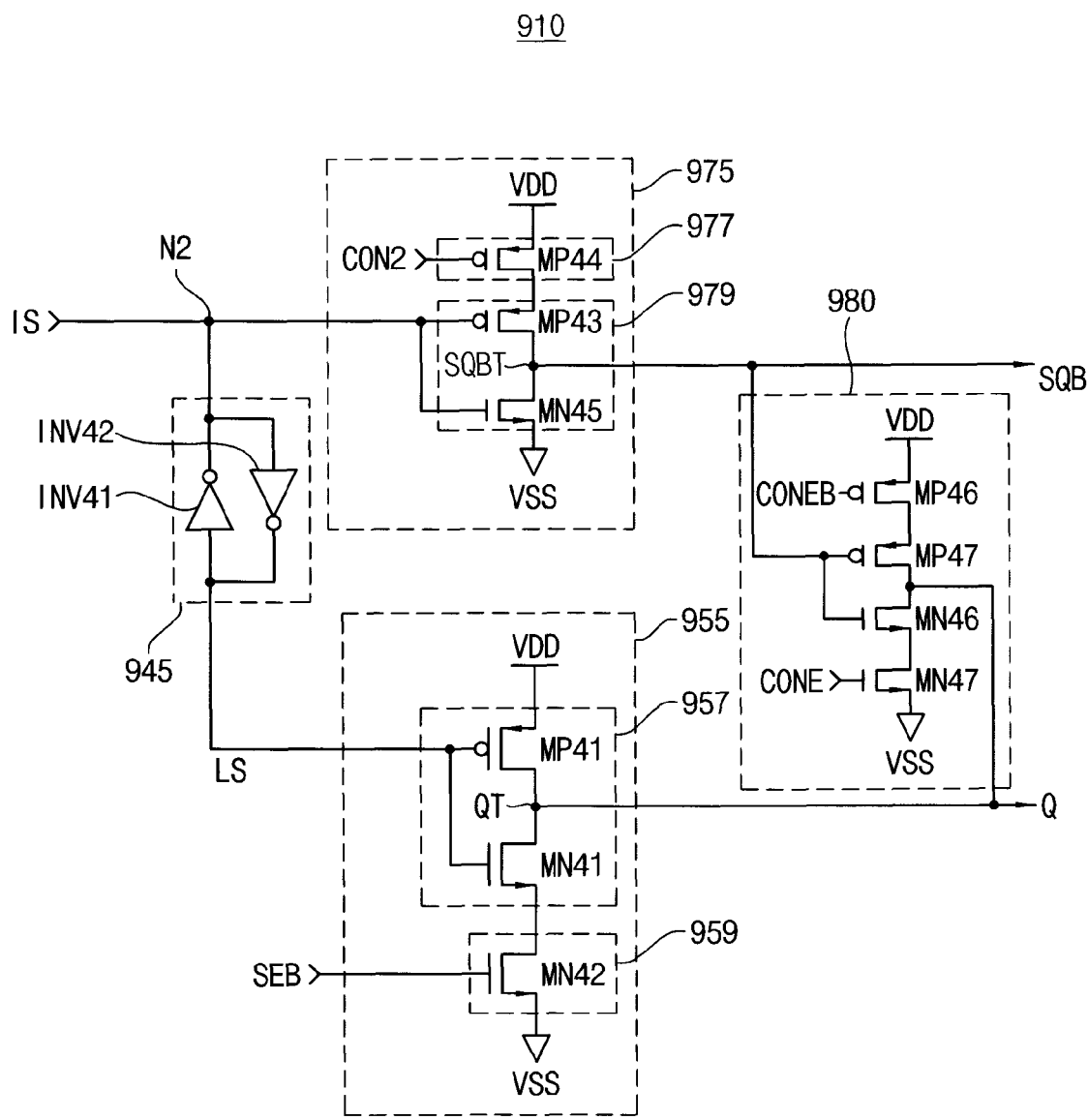

FIGS. 11A and 11B are circuit diagrams illustrating examples of the output unit of FIG. 10.

Referring to FIG. 11A, the output unit 900 may include a latch unit 945, a data output unit 955, a scan output unit 965 and a data output enhancement unit 980.

The latch unit 945 may include a first inverter INV41 and a second inverter INV42, where inputs and outputs of the inverters INV41 and INV42 are cross-coupled. The output of the first inverter INV41 and the input of the second inverter INV42 may be connected to the latch node N2. The latch unit 945 may latch the intermediate signal IS to generate the latch signal LS.

The data output unit 955 may include a first buffer unit 957 and a first power switching unit 959. The first buffer unit 957 may generate the data output signal Q based on the latch signal LS in the first operation mode. The first power switching unit 959 may activate the first buffer unit 957 in the first operation mode and may deactivate the first buffer unit 957 in the second operation mode in response to the inverted scan enable signal SEB. The first buffer unit 957 may be implemented with a first inverter that includes a first PMOS transistor MP41 and a first NMOS transistor MN41. The first power switching unit 959 may include a first switching transistor MN42.

The scan output unit 965 may include a second buffer unit 967 and a second power switching unit 969. The second buffer unit 967 may generate the scan output signal SQB based on the intermediate signal IS in the second operation mode. The second power switching unit 969 may activate the second buffer unit 967 in the second operation mode and may deactivate the second buffer unit 967 in the first operation mode in response to the second enable signal CON2. The second buffer unit 967 may be implemented with a second inverter that includes a second PMOS transistor MP42 and a second NMOS transistor MN43. The second power switching unit 969 may include a second switching transistor MN44. In an example embodiment, the second control signal CON2 may be the scan enable signal SE. In another example embodiment, the second control signal CON2 may be generated by performing an OR operation on the scan enable signal SE and an output enhancement control signal CONE.

The data output enhancement unit 980 may be implemented with a tri-state inverter because the polarity of the data output signal Q is opposite to the polarity of the scan output signal SQB. The tri-state inverter may have an input terminal connected to the scan output terminal SQBT and an output terminal connected to the data output terminal QT and may be controlled in response to the output enhancement control signal CONE. The tri-state inverter may provide an additional current to the data output terminal QT in the first operation mode based on the output enhancement control signal CONE and the voltage level at the scan output terminal SQBT.

The tri-state inverter may include a third PMOS transistor MP46, a fourth PMOS transistor MP47, a third NMOS transistor MN46 and a fourth NMOS transistor MN47. The transistors MP46, MP47, MN46 and MN47 may be connected between the power supply voltage VDD and the ground voltage VSS in serial. For example, the third PMOS transistor MP46 may include a first electrode (e.g., a source) connected to the power supply voltage VDD, a gate electrode connected to the inverted signal CONEB of the output enhancement control signal CONE and a second electrode (e.g., a drain). The fourth PMOS transistor MP47 may include a first electrode (e.g., a source) connected to the second electrode of the third PMOS transistor MP46, a gate electrode connected to the scan output terminal SQBT and a second electrode connected to the data output terminal QT. The third NMOS transistor MN46 may include a first electrode (e.g., a drain) connected to the data output terminal QT, a gate electrode connected to the scan output terminal SQBT and a second electrode (e.g., a source). The fourth NMOS transistor MN47 may include a first electrode (e.g., a drain) connected to the second electrode of the third NMOS transistor MN46, a gate electrode connected to the output enhancement control signal CONE and a second electrode connected to the ground voltage VSS.

In an example embodiment, sizes of the transistors MP46, MP47, MN46 and MN47 included in the data output enhancement unit 980 are the same as sizes of the transistors MP42, MN43 and MN44 included in the scan output unit 965.

Hereinafter, operations of the data output enhancement unit 980 depending on the operation modes will be described with reference to FIG. 11A.

In the first operation mode, the output enhancement control signal CONE has the logic high level and the inverted output enhancement control signal CONEB has the logic low level. The power supply voltage VDD and the ground voltage VSS are applied to the tri-state inverter, and thus the tri-state inverter is turned on. One of the power supply voltage VDD and the ground voltage VSS applied to the tri-state inverter may be provided to the data output terminal QT depending on the voltage level of the intermediate signal IS. Thus, the additional current may be provided to the data output terminal QT to enhance the data output signal Q. In the second operation mode, the output enhancement control signal CONE has the logic low level and the inverted output enhancement control signal CONEB has the logic high level. The tri-state inverter is turned off and the output unit 900 provides the scan output signal SQB through the scan output terminal SQBT.

Referring to FIG. 11B, the output unit 910 may include a latch unit 945, a data output unit 955, a scan output unit 975 and a data output enhancement unit 980.

The latch unit 945, the data output unit 955 and the data output enhancement unit 980 in FIG. 11B are the same as the latch unit 945, the data output unit 955 and the data output enhancement unit 980 in FIG. 11A, respectively. Thus, in FIG. 11B, the same reference numerals will be used to refer the same or like elements in FIG. 11A.

The scan output unit 975 may include a second buffer unit 977 and a second power switching unit 979. The second buffer unit 977 may generate the scan output signal SQB based on the intermediate signal IS in the second operation mode. The second power switching unit 979 may activate the second buffer unit 977 in the second operation mode and may deactivate the second buffer unit 977 in the first operation mode in response to the second control signal CON2. The second buffer unit 977 may be implemented with a second inverter that includes a second PMOS transistor MP43 and a second NMOS transistor MN44. The second power switching unit 979 may include a second switching transistor MP44. In an example embodiment, the second control signal CON2 may be the inverted scan enable signal SEB. In another example embodiment, the second control signal CON2 may be generated by performing an OR operation on the scan enable signal SE and an output enhancement control signal CONE and by inverting the signal generated based on the OR operation.

In some example embodiments, the data output unit 322 in FIGS. 9A and 9B and the data output unit 955 in FIGS. 11A and 11B may be replaced with the data output unit 340 of FIG. 5.

FIG. 12 is a timing diagram illustrating an operation of the scan flip-flop circuit of FIG. 1. In FIG. 12, the scan flip-flop circuit 1000 generates one of the data output signal D and the scan output signal SQ in synchronization with rising edges of the clock signal CK.

Referring to FIGS. 1 and 12, during a time period of T1, the scan enable signal SE has the logic low level at each rising edge of the clock signal CK and the scan flip-flop circuit 100 operates in the first operation mode. The scan flip-flop circuit 1000 generates the data output signal Q based on the data input signal D and provides the data output signal Q through the data output terminal QT in synchronization with rising edges of the clock signal CK. As illustrated in FIG. 12, the voltage level at the data output terminal QT bidirectionally transitions between the first voltage level and the second voltage level. As described above with reference to FIGS. 4A and 4B, the scan output unit is deactivated by the second power switching unit included in the scan output unit and prevents the voltage level at the scan output terminal SQT from toggling. Thus, the voltage level at the scan output terminal SQT unidirectionally transitions between the first voltage level and the second voltage level and the scan output signal SQ has a voltage level that is regardless of a voltage level at the scan input signal SI.

During a time period of T2, the scan enable signal SE has the logic high level at each rising edge of the clock signal CK and the scan flip-flop circuit 1000 operates in the second operation mode. The scan flip-flop circuit 1000 generates the scan output signal SQ based on the scan input signal SI and provides the scan output signal SQ through the scan output terminal SQT in synchronization with rising edges of the clock signal CK. As illustrated in FIG. 12, the voltage level at the scan output terminal SQT bidirectionally transitions between the first voltage level and the second voltage level. The data output unit is deactivated by the first power switching unit included in the data output unit and prevents the voltage level at the data output terminal QT from toggling. Thus, the voltage level at the data output terminal QT unidirectionally transitions between the first voltage level and the second voltage level and the data output signal Q has a voltage level that is regardless of a voltage level of the data input signal D.

During a time period of T3, the scan enable signal SE has the logic low level at each rising edge of the clock signal CK and the scan flip-flop circuit 1000 operates in the first operation mode. The voltage level at the data output terminal QT bidirectionally transitions between the first voltage level and the second voltage level. The voltage level at the scan output terminal SQT unidirectionally transitions between the first voltage level and the second voltage level.

Figure 13:
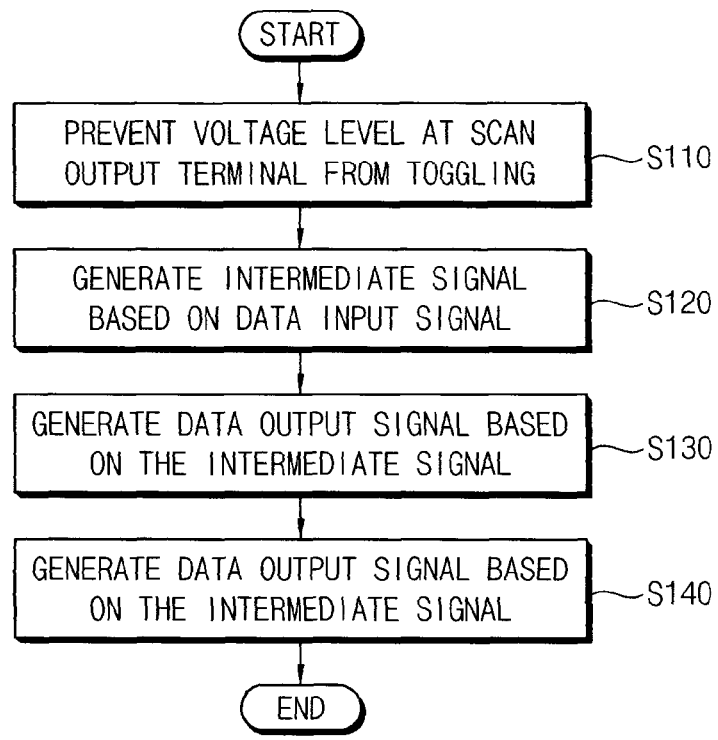
FIGS. 13 and 14 are flow charts illustrating operations of the scan flip-flop circuit of FIG. 1.
Figure 14:
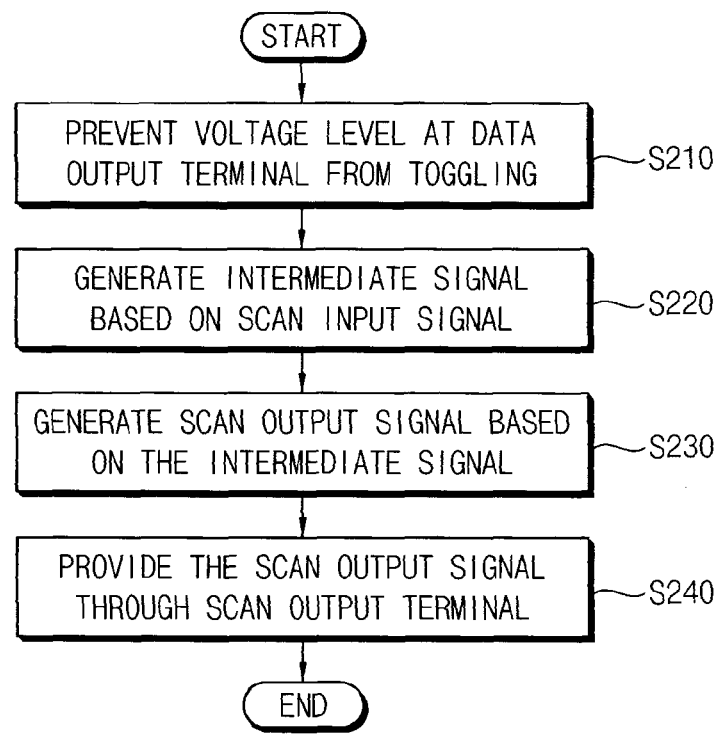

FIGS. 13 and 14 are flow charts illustrating operations of the scan flip-flop circuit of FIG. 1. FIG. 13 illustrates the operation of the scan flip-flop circuit 1000 in the first operation mode. FIG. 14 illustrates the operation of the scan flip-flop circuit 100 in the second operation mode.

Referring to FIGS. 1, 4A and 13, in the first operation mode, the second power switching unit 334 is turned off and the toggling of the voltage level at the scan output terminal SQT is prevented by the second power switching unit 334 (step S110). For example, the voltage level at the scan output terminal SQT may unidirectionally transition between the first voltage level and the second voltage level. The input unit 100 selects the data input signal D and generates the intermediate signal IS based on the data input signal D (step S120). The output unit 200 generates the data output signal Q based on the intermediate signal IS (step S130), and provide the data output signal Q through the data output terminal QT (step S140). In an example embodiment, the output unit 200 may further perform an operation of enhancing the data output signal Q.

Referring to FIGS. 1, 4A and 14, in the second operation mode, the first power switching unit 324 is turned off and the toggling of the voltage level at the data output terminal QT is prevented by the first power switching unit 324 (step S210). For example, the voltage level at the data output terminal QT may unidirectionally transition between the first voltage level and the second voltage level. The input unit 100 selects the scan input signal SI and generates the intermediate signal IS based on the scan input signal SI (step S220). The output unit 200 generates the scan output signal SQ based on the intermediate signal IS (step S230), and provide the scan output signal SQ through the scan output terminal SQT (step S240).

Figure 15:
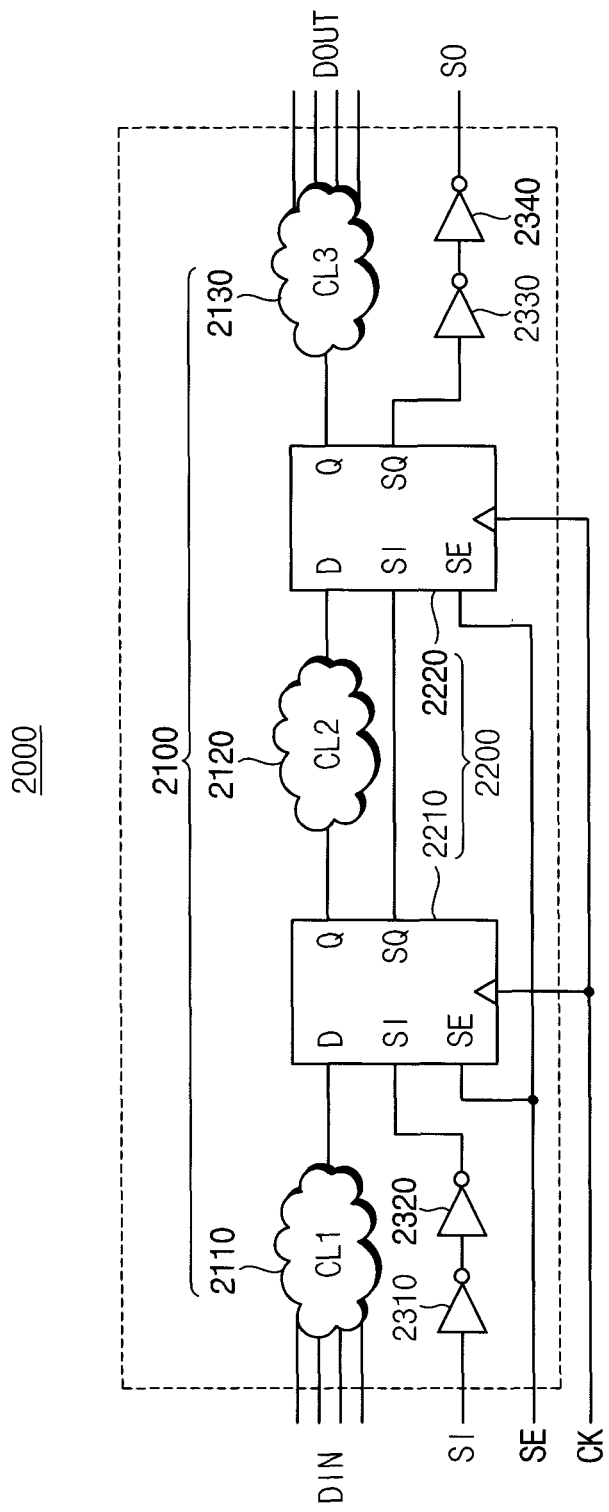
FIG. 15 is a block diagram illustrating a scan test circuit according some example embodiments.

FIG. 15 is a block diagram illustrating a scan test circuit according some example embodiments.

Referring to FIG. 15, the scan test circuit 2000 includes a combinational logic unit 2100, a sequential logic unit 2200 and buffers 2310, 2320, 2330 and 2340. The combinational logic unit 2100 may include a first combinational logic circuit 2110, a second combinational logic circuit 2120 and a third combinational logic circuit 2130. The sequential logic unit 2200 may include a first scan flip-flop circuit 2210 and a second scan flip-flop circuit 2220.

The first combinational logic circuit 2110 performs a logic operation on an input data DIN to generate a first data input signal. The buffers 2310 and 2320 buffer a scan input signal SI.

The first scan flip-flop circuit 2210 may be the scan flip-flop circuit 1000 of FIG. 1. The first scan flip-flop circuit 2210 selects one of the first data input signal and the buffered scan input signal SI as a first input signal depending on operation modes, generates one of a first data output signal and a first scan output signal as a first output signal based on the first input signal and selects one of a first data output terminal and a first scan output terminal as a first output terminal depending on the operation modes to provide the first output signal through the first output terminal. A voltage level at the selected first output terminal bidirectionally transitions between a first voltage level and a second voltage level. A voltage level at a non-selected first output terminal unidirectionally transitions between the first voltage level and the second voltage level.

For example, the first scan flip-flop circuit 2210 may generate the first data output signal based on the first data input signal to provide the first data output signal through the first data output terminal in a first operation mode (e.g., a normal operation mode). A voltage level at the first scan output terminal may unidirectionally transition between the first voltage level and the second voltage level in the first operation mode. The first scan flip-flop circuit 2210 may generate the first scan output signal based on the buffered scan input signal SI to provide the first scan output signal through the first scan output terminal in a second operation mode (e.g., a scan test mode). A voltage level at the first data output terminal may unidirectionally transition between the first voltage level and the second voltage level in the second operation mode.

The second combinational logic circuit 2120 performs the logic operation on the first data output signal to generate a second data input signal.

The second scan flip-flop circuit 2220 may be the scan flip-flop circuit 1000 of FIG. 1. The second scan flip-flop circuit 2220 selects one of the second data input signal and the first scan output signal as a second input signal depending on the operation modes, generates one of a second data output signal and a second scan output signal as a second output signal based on the second input signal and selects one of a second data output terminal and a second scan output terminal as a second output terminal depending on the operation modes to provide the second output signal through the second output terminal. A voltage level at the selected second output terminal bidirectionally transitions between the first voltage level and the second voltage level. A voltage level at a non-selected second output terminal unidirectionally transitions between the first voltage level and the second voltage level.

For example, the second scan flip-flop circuit 2220 may generate the second data output signal based on the second data input signal to provide the second data output signal through the second data output terminal in the first operation mode. A voltage level at the second scan output terminal may unidirectionally transition between the first voltage level and the second voltage level in the first operation mode. The second scan flip-flop circuit 2220 may generate the second scan output signal based on the first scan output signal to provide the second scan output signal through the second scan output terminal in the second operation mode. A voltage level at the second data output terminal may unidirectionally transition between the first voltage level and the second voltage level in the second operation mode.

The third combinational logic circuit 2130 performs the logic operation on the second data output signal to generate output data DOUT. The buffers 2330 and 2340 buffer the second scan output signal to generate a scan output SO. In an example embodiment, the buffers 2310, 2320, 2330 and 2340 may be inverters, respectively.

Although three combinational logic circuits 2110, 2120 and 2130, two scan flip-flop circuits 2210 and 2220 and four buffers 2310, 2320, 2330 and 2340 are illustrated in FIG. 15 for convenience of illustration, the scan test circuit 2000 should not be limited thereto and may include a plurality of combinational logic circuits, a plurality of scan flip-flop circuits and a plurality of buffers.

In the scan test circuit 2000 including the scan flip-flop circuits 2210 and 2220, a data path and a scan path are separated from each other. In the scan test mode, the variation of the voltage level of the data path and a voltage drop in a power network of the scan test circuit 2000 may be reduced. In addition, the variation of the hold time of the scan flip-flop-circuits 2210 and 2220 may be reduced. Thus, the scan test circuit 2000 may have relatively high operation speed and low power consumption.

Example embodiments are not limited to a specific flip-flop circuit but may be adopted in all kinds of flip-flop circuit such as RS flip-flop circuit, JK flip-flop circuit, D flip-flop circuit and T flip-flop circuit. Particularly, example embodiments may be adopted in a flip-flop circuit having a scan function and a semiconductor device including the flip-flop circuit.

While the example embodiments and their advantages have been described in detail, it should be understood that various changes, substitutions and alterations may be made herein without departing from the scope of inventive concepts.

What is claimed is:

1. A scan flip-flop circuit comprising:
    a data output unit configured to provide a data output terminal with a data output signal in response to a data input signal and a first control signal in a first operation mode, and the data output unit configured to prohibit the data output terminal from being provided with a power supply voltage applied to the scan flip-flop circuit in response to the data input signal and the first control signal in a second operation mode;
    a scan output unit configured to provide a scan output terminal with a scan output signal in response to a scan input signal and a second control signal in the second operation mode; and
    a data output enhancement unit coupled between the data output terminal and the scan output terminal, the data enhancement unit configured to modify the data output signal based on a third control signal in the first operation mode.

2. The scan flip-flop circuit of claim 1, wherein data output terminal is configured to output a voltage unidirectionally transitioning between a first voltage level and a second voltage level in the second operation mode, and scan output terminal is configured to output a voltage level unidirectionally transitioning between the first voltage level and the second voltage level in the first operation mode.

3. The scan flip-flop circuit of claim 1, wherein the scan output unit is configured to prohibit the scan output terminal from being provided with one of the power supply voltage and the ground voltage applied to the scan flip-flop circuit in response to the scan input signal and the second control signal in the first operation mode.

4. The scan flip-flop circuit of claim 3, wherein data output terminal is configured to output a voltage level bidirectionally transitioning between a first voltage level and a second voltage level in the first operation mode, and the scan output terminal is configured to output a voltage level bidirectionally transitioning between the first voltage level and the second voltage level in the second operation mode.

5. The scan flip-flop circuit of claim 1, wherein the data output unit includes:
    a buffer unit configured to generate the data output signal in response to a first signal corresponding to the data input signal in the first operation mode; and
    a power switching unit configured to activate the buffer unit in the first operation mode and deactivate the buffer unit in the second operation mode in response to the first control signal.

6. The scan flip-flop circuit of claim 5, wherein the buffer unit includes:
    a first metal oxide semiconductor (MOS) transistor having a first electrode, a gate electrode connected to the first signal, and a second electrode connected to the data output terminal; and
    a second MOS transistor having a third electrode connected to the data output terminal, a gate electrode connected to the first signal, and a fourth electrode.

7. The scan flip-flop circuit of claim 6, wherein the power switching unit includes:
    a third MOS transistor having a fifth electrode connected to the power supply voltage, a gate electrode connected to the first control signal, and a sixth electrode connected to the first electrode of the first MOS transistor, and
    wherein the fourth electrode of the second MOS transistor is connected to the ground voltage.

8. The scan flip-flop circuit of claim 7, wherein the third MOS transistor is turned off in response to the first control signal and the power supply voltage is not applied to the buffer unit in the second operation mode.

9. The scan flip-flop circuit of claim 3, wherein the scan output unit includes:
    a buffer unit configured to generate the scan output signal in response to a first signal corresponding to the scan input signal in the second operation mode; and
    a power switching unit configured to activate the buffer unit in the second operation mode and deactivate the buffer unit in the first operation mode in response to the second control signal.

10. The scan flip-flop circuit of claim 9, wherein the buffer unit includes:
    a first MOS transistor having a first electrode, a gate electrode connected to the first signal, and a second electrode connected to the scan output terminal; and
    a second MOS transistor having a third electrode connected to the scan output terminal, a gate electrode connected to the first signal, and a fourth electrode.

11. The scan flip-flop circuit of claim 3, wherein the first control signal is an inverted signal of the second control signal.

12. A method of operating a scan flip-flop circuit, the method comprising:
    providing a data output signal through a data output terminal of a data output unit in response to a data input signal and a first control signal in a first operation mode;
    prohibiting the data output terminal from being provided with a power supply voltage applied to the scan flip-flop circuit in a second operation mode;
    providing a scan output signal through a scan output terminal of a scan output unit in response to a scan input signal and a second control signal in the second operation mode; and
    modifying the data output signal based on a third control signal in the first operation mode.

13. The method of claim 12, further comprising:
    prohibiting the scan output terminal from being provided with one of the power supply voltage and the ground voltage in the second operation mode.

14. The method of claim 13, wherein the voltage level at the data output terminal is unidirectionally transitioned between a first voltage level and a second voltage level in the second operation mode, and the voltage level at the scan output terminal is unidirectionally transitioned between the first voltage level and the second voltage level in the first operation mode.

15. The method of claim 12, wherein the voltage level at the data output terminal is bidirectionally transitioned between a first voltage level and a second voltage level in the first operation mode, and the voltage level at the scan output terminal is bidirectionally transitioned between the first voltage level and the second voltage level in the second operation mode.

16. The method of claim 12, wherein the data output unit includes:
- a first MOS transistor having a first electrode connected to the power supply voltage, a gate electrode connected to the first control signal, and a second electrode;
- a second MOS transistor having a third electrode connected to the second electrode of the first MOS transistor, a gate electrode connected to a first signal corresponding to the data input signal, and a fourth electrode connected to the data output terminal; and
- a third MOS transistor having a fifth electrode connected to the data output terminal, a gate electrode connected to the first signal, and a sixth electrode connected to the ground voltage, and
- wherein the first MOS transistor is turned off in response to the first control signal and the power supply voltage is not applied to the data output terminal in the second operation mode.

17. A scan flip-flop circuit comprising:
- a latch unit configured to latch a data input signal and a scan input signal;
- a data output unit configured to generate a data output signal in response to the latched data input signal and to provide a data output terminal with the data output signal in response to the latched data input signal and a first control signal in a first operation mode, and configured to prohibit the data output terminal from being provided with a power supply voltage applied to the scan flip-flop circuit in response to the data input signal and the first control signal in a second operation mode;
- a scan output unit configured to generate a scan output signal in response to the latched scan input signal and to provide a scan output terminal with the scan output signal in response to the latched scan input signal and a second control signal in the second operation mode, and configured to prohibit the scan output terminal from being provided with one of the power supply voltage and the ground voltage applied to the scan flip-flop circuit in response to the data input signal and the second control signal in the first operation mode,
- wherein the data output terminal is configured to output a voltage level unidirectionally transitioning between a first voltage level and a second voltage level in the second operation mode, and the scan output terminal is configured to output a voltage level unidirectionally transitioning between the first voltage level and the second voltage level in the first operation mode, and
- wherein the data output terminal is configured to output a voltage level bidirectionally transitioning between the first voltage level and the second voltage level in the first operation mode, and the scan output terminal is configured to output a voltage level bidirectionally transitioning between the first voltage level and the second voltage level in the second operation mode; and
- a data output enhancement unit coupled between the data output terminal and the scan output terminal, the data enhancement unit configured to modify the data output signal based on a third control signal in the first operation mode.

18. A scan flip-flop circuit comprising:
- a data output unit configured to provide a data output terminal with a data output signal in response to a data input signal and a first control signal in a first operation mode; and
- a scan output unit configured to provide a scan output terminal with a scan output signal in response to a scan input signal and a second control signal in a second operation mode, the scan output unit configured to prohibit the scan output terminal from being provided with a power supply voltage applied to the scan flip-flop circuit in response to the data input signal and the second control signal in the first operation mode; and
- a data output enhancement unit coupled between the data output terminal and the scan output terminal, the data enhancement unit configured to modify the data output signal based on a third control signal in the first operation mode.

* * * * *